United States Patent
Kumada

(10) Patent No.: US 12,272,728 B2
(45) Date of Patent: Apr. 8, 2025

(54) SILICON CARBIDE SEMICONDUCTOR DEVICE

(71) Applicant: FUJI ELECTRIC CO., LTD., Kawasaki (JP)

(72) Inventor: Keishirou Kumada, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 478 days.

(21) Appl. No.: 17/855,387

(22) Filed: Jun. 30, 2022

(65) Prior Publication Data

US 2023/0062475 A1 Mar. 2, 2023

(30) Foreign Application Priority Data

Aug. 27, 2021 (JP) ................. 2021-139012

(51) Int. Cl.
H01L 29/16 (2006.01)
H01L 29/423 (2006.01)
H01L 29/66 (2006.01)

(52) U.S. Cl.
CPC ...... H01L 29/1608 (2013.01); H01L 29/4236 (2013.01); H01L 29/66068 (2013.01)

(58) Field of Classification Search
CPC ............ H01L 21/26506; H01L 21/761; H01L 29/0615; H01L 29/0619; H01L 29/0623; H01L 29/0638; H01L 29/0692; H01L 29/0696; H01L 29/1095; H01L 29/1608; H01L 29/32; H01L 29/4236; H01L 29/66068; H01L 29/7811; H01L 29/7813
USPC ........................................... 257/270
See application file for complete search history.

(56) References Cited

U.S. PATENT DOCUMENTS

| | | | |
|---|---|---|---|
| 2018/0350900 A1 | 12/2018 | Nakamata et al. | |
| 2018/0374918 A1* | 12/2018 | Nishio | H01L 29/32 |
| 2019/0165102 A1 | 5/2019 | Fujimoto | |
| 2021/0272797 A1* | 9/2021 | Kodama | H01L 29/7397 |
| 2021/0273117 A1* | 9/2021 | Hoshi | H01L 29/7804 |
| 2022/0336590 A1* | 10/2022 | Kumada | H01L 29/66068 |
| 2022/0399438 A1* | 12/2022 | Hoshi | H01L 21/0465 |

FOREIGN PATENT DOCUMENTS

| | | |
|---|---|---|
| JP | 2018-206873 A | 12/2018 |
| JP | 2019-080035 A | 5/2019 |
| JP | 2019-102493 A | 6/2019 |
| JP | 2020-191420 A | 11/2020 |

* cited by examiner

*Primary Examiner* — Fazli Erdem
(74) *Attorney, Agent, or Firm* — Rabin & Berdo, P.C.

(57) ABSTRACT

In an intermediate region surrounding a periphery of an active region, a gate polysilicon wiring layer is provided on a gate insulating film at a front surface of a semiconductor substrate, via a field oxide film. An inner end portion of the gate polysilicon wiring layer faces a p-type region of a surface region at the front surface of the semiconductor substrate, via only the gate insulating film. In the intermediate region, at corners thereof facing corners of the active region, a low carrier lifetime region containing a carrier lifetime killer is provided so as to overlap the p-regions and, in a depth direction, face the gate polysilicon wiring layer, whereby the lifetime of the minority carriers of the corner portions of the intermediate region is shorter than the lifetime of the minority carriers of linear portions of the intermediate region.

12 Claims, 13 Drawing Sheets

SILICON CARBIDE SEMICONDUCTOR DEVICE

CROSS REFERENCE TO RELATED APPLICATIONS

This application is based upon and claims the benefit of priority of the prior Japanese Patent Application No. 2021-139012, filed on Aug. 27, 2021, the entire contents of which are incorporated herein by reference.

BACKGROUND OF THE INVENTION

1. Field of the Invention

Embodiments of the invention relate to a silicon carbide semiconductor device.

2. Description of the Related Art

Conventionally, metal oxide semiconductor field effect transistors (SiC-MOSFETs) having insulated gates with a 3-layer structure including a metal, an oxide film, and a semiconductor are commonly known silicon carbide semiconductor devices that contain silicon carbide (SiC) as a semiconductor material. In a SiC-MOSFET, in an intermediate region between an active region and an edge termination region, a gate insulating film extends on a front surface of a semiconductor substrate from the active region, and a gate runner is provided on the gate insulating film via a field oxide film.

The active region is a region in which unit cells (constituent units of a device element) of the SiC-MOSFET are disposed and through which a main current (drift current) flows. The intermediate region surrounds a periphery of the active region. The gate runner, a gate pad, a sensing pad, etc. are disposed in the intermediate region, and the intermediate region is free of the unit cells of the SiC-MOSFET. The gate runner has a function of conveying variation in the potential of the gate pad (electrode pad) to gate electrodes of the unit cells in the active region. A sensing pad is an electrode pad for a circuit portions such as a current sensing portion, a temperature sensing portion, and an overcurrent protecting portion for protecting/controlling the unit cells in the active region.

A structure of a conventional silicon carbide semiconductor device is described. FIG. 11 is a plan view of a portion of a layout when the conventional silicon carbide semiconductor device is viewed from a front side of a semiconductor substrate. FIG. 11 depicts a vicinity of a corner (vertex) 201a of an active region 201. FIGS. 12 and 13 are cross-sectional views of the structure along cutting line AA-AA' and cutting line BB-BB' in FIG. 11, respectively. A conventional silicon carbide semiconductor device 230 depicted in FIGS. 11 to 13 is a vertical SiC-MOSFET with a trench structure and a semiconductor substrate (semiconductor chip) 210 that contains SiC and has the active region 201 and an edge termination region 202 that surrounds the active region 201.

The semiconductor substrate 210 is formed by epitaxially growing epitaxial layers 212, 213 sequentially on an $n^+$-type starting substrate 211 containing SiC, the epitaxial layers 212, 213 constituting an $n^-$-type drift region 232 and a p-type base region 234. The semiconductor substrate 210 has a main surface having the p-type epitaxial layer 213 assumed as a front surface and a main surface having the $n^+$-type starting substrate 211 assumed as a back surface. The active region 201 is a region through which the main current (drift current) flows when the MOSFET is on and in which multiple unit cells of the MOSFET, each having the same structure, are disposed adjacent to one another. The active region 201 has a substantially rectangular shape in a plan view and is provided in substantially a center (chip center) of the semiconductor substrate 210.

In the active region 201, a general trench structure is provided on a front side of the semiconductor substrate 210. The trench structure is configured by the p-type base region 234, $n^+$-type source regions 235, a $p^{++}$-type contact region 236, gate trenches 237, a gate insulating film 238, and gate electrodes 239. The gate trenches 237 extend linearly in a first direction X (longitudinal direction) that is parallel to the front surface of the semiconductor substrate 210 and terminate in an intermediate region 203. The gate trenches 237 are disposed in a striped pattern so as to be adjacent to one another in a second direction Y (traverse direction) that is parallel to the front surface of the semiconductor substrate 210 and orthogonal to the first direction X.

The gate trenches 237 are disposed so as to be adjacent to one another in the second direction Y, whereby the unit cells having the same structure are disposed adjacently in the second direction Y. The gate insulating film 238 is provided along inner walls of the gate trenches 237 and extends on the front surface of the semiconductor substrate 210, from the inner walls of the gate trenches 237. On the front surface of the semiconductor substrate 210, the gate insulating film 238 reaches a chip end from the active region 201. The gate electrodes 239 are provided on the gate insulating film 238 in the gate trenches 237, so as to be embedded in the gate trenches 237.

At ends of the gate trenches 237 in the longitudinal direction, the gate electrodes 239 are connected to a later-described gate polysilicon (poly-Si) wiring layer 262. An interlayer insulating film 240 is provided on the gate insulating film 238 at the front surface of the semiconductor substrate 210 and spans an entire area of the front surface of the semiconductor substrate 210 so as to cover the gate electrodes 239, the gate polysilicon wiring layer 262 and a field oxide film 261. In the active region 201, contact holes 240a, 240b that penetrate through the interlayer insulating film 240 and the gate insulating film 238 in a depth direction Z and reach the front surface of the semiconductor substrate 210 are provided.

The contact holes 240a, 240b of the active region 201 extend in a striped pattern in the first direction X. The outermost contact hole 240b of the active region 201 is provided closer to the chip end in the second direction Y than is an outermost one of the gate trenches 237, the outermost contact hole 240b exposing in an entire area thereof, a later-described $p^{++}$-type contact extension portion 236a. Each of the contact holes 240a of the active region 201 is provided between a respective adjacent two of the gate trenches 237, thereby exposing the $n^+$-type source regions 235 and the $p^{++}$-type contact region 236 and exposing the $p^{++}$-type contact extension portion 236a at ends in the first direction X (longitudinal direction).

The intermediate region 203 between the active region 201 and the edge termination region 202 is adjacent to the active region 201 and surrounds a periphery of the active region 201 in a substantially rectangular shape. In the intermediate region 203, the $p^{++}$-type contact extension portion 236a is provided in a surface region at the front surface of the semiconductor substrate 210, so as to face an entire surface of the gate polysilicon wiring layer 262 in the depth direction Z. The $p^{++}$-type contact extension portion 236a is a portion of the $p^{++}$-type contact region 236 extending in the intermediate region 203. The $p^{++}$-type contact extension portion 236a is provided in an entire area between the front surface of the semiconductor substrate 210 and a p-type base extension portion 234a.

The $p^{++}$-type contact extension portion 236a is exposed in an entire area of the outermost contact hole 240b of the active region 201. The p-type base extension portion 234a is a portion of the p-type base region 234 extending in the intermediate region 203. A $p^+$-type extension portion 252a is provided between the p-type base extension portion 234a and the $n^-$-type drift region 232. The $p^+$-type extension portion 252a, the p-type base extension portion 234a, and the $p^{++}$-type contact extension portion 236a surround the periphery of the active region 201, are provided in an entire area of the intermediate region 203, and extend inward (toward the chip center) to the gate trenches 237, from the intermediate region 203.

The gate insulating film 238 on the front surface of the semiconductor substrate 210 is provided spanning an entire area of the intermediate region 203 and the edge termination region 202. In the intermediate region 203, the gate polysilicon wiring layer 262 and a gate metal wiring layer 263 constituting a gate runner are sequentially stacked on the gate insulating film 238 on the front surface of the semiconductor substrate 210, via the field oxide film 261. The field oxide film 261 has a chip-center end (inner end) 261a that faces the chip center, the chip-center end 261a being positioned closer to the chip end than is a border between the active region 201 and the intermediate region 203 (ends of the contact holes 240a, 240b in the longitudinal direction and a chip-end sidewall (sidewall closest to chip end) of the contact hole 240b), along the entire periphery of the active region 201.

The gate polysilicon wiring layer 262 is provided on the field oxide film 261 and surrounds the periphery of the active region 201. The gate polysilicon wiring layer 262 extends closer to the chip center than is the chip-center end 261a of the field oxide film 261 and terminates on the gate insulating film 238 at the front surface of the semiconductor substrate 210 in the intermediate region 203. Therefore, a chip-center portion 262b (portion facing the chip center) of the gate polysilicon wiring layer 262 faces the semiconductor substrate 210 in the depth direction Z with only the gate insulating film 238 intervening therebetween, the gate insulating film 238 having a thickness that is thinner than that of the field oxide film 261. The field oxide film 261 and the gate polysilicon wiring layer 262 are covered by the interlayer insulating film 240.

Reference numerals 241, 242, and 222 are a source electrode, a passivation film, and an $n^+$-type channel stopper region, respectively. Reference numeral 233 is an n-type current spreading region. Reference numerals 251 and 252 are $p^+$-type regions for mitigating electric field of the gate insulating film 238 at bottoms of the gate trenches 237. The $p^+$-type region 252 is between the gate trenches 237 that are adjacent to one another and the $p^+$-type extension portion 252a is a portion of the $p^+$-type region 252 extending in the intermediate region 203. Reference character 262a is a chip-center end of the gate polysilicon wiring layer 262. Reference numeral 221 is a $p^-$-type region configuring a voltage withstanding structure 220 of the edge termination region 202.

In the conventional silicon carbide semiconductor device 230 (SiC-MOSFET), parasitic capacitances (gate-source capacitance Cgs, gate-drain capacitance Cgd, drain-source capacitance Cds) are formed in the semiconductor substrate 210. Electrons and holes accumulated in the semiconductor substrate along the parasitic capacitances when the SiC-MOSFET is on or off are discharged to an external destination through a drain electrode 243 and the source electrode 241, respectively, during a switching transition period for the SiC-MOSFET to switch from on to off (or from off to on), reverse recovery of a parasitic diode formed by main junctions (pn junctions) of the SiC-MOSFET, etc.

As for a conventional vertical SiC-MOSFET, a device has been proposed that has a structure in which a $p^+$-type region having an impurity concentration that is higher than that of a p-type base region is provided in a corner portion of an active region, and displacement current that occurs in the edge termination region during a switching transition period from on to off is pulled out from the $p^+$-type region to the source electrode (for example, refer to Japanese Laid-Open Patent Publication No. 2018-206873). In Japanese Laid-Open Patent Publication No. 2018-206873, the structure is such that the displacement current that occurs in the edge termination region during the switching transition period from on to off is pulled out to the source electrode from the $p^+$-type region in the corner portion of the active region, whereby application of high electric field to a gate insulating film and a field oxide film near the corner portion of the active region is suppressed.

As for another conventional vertical SiC-MOSFET, a device has been proposed in which a low carrier lifetime region in which the lifetime of minority carriers is short is provided in a region of a main non-operating region through which a main current of a main MOSFET does not flow, said region excluding a sensing region in which a current sensing portion (sensing MOSFET) is disposed (for example, refer to Japanese Laid-Open Patent Publication No. 2020-191420). In Japanese Laid-Open Patent Publication No. 2020-191420, an inflow of displacement current from the main non-operating region into the sensing region is suppressed by the low carrier lifetime region, whereby in an entire area of said region of the main non-operating region excluding the sensing region, a p-type base region of the main MOSFET is disposed and local concentration of electric field at a field oxide film is suppressed.

SUMMARY OF THE INVENTION

According to an embodiment of the invention a silicon carbide semiconductor device includes: a semiconductor substrate containing silicon carbide, the semiconductor substrate having a first main surface and a second main surface opposite to each other, the semiconductor substrate further having: an active region through which a main current flows, the active region being provided in a rectangular shape in a plan view of the silicon carbide semiconductor device, a termination region surrounding a periphery of the active region, and an intermediate region between the active region and the termination region; a first semiconductor region of a first conductivity type, provided in the semiconductor substrate; a second semiconductor region of a second conductivity type, provided between the first main surface of the semiconductor substrate and the first semiconductor region, spanning the active region and the intermediate region; a plurality of third semiconductor regions of the first conductivity type, selectively provided in the active region, between the first main surface of the semiconductor substrate and the second semiconductor region; a gate insulating film provided in contact with a region of the second semiconductor region, between the first semiconductor region and one of the plurality of third semiconductor regions, the gate insulating film covering the first main surface of the semiconductor substrate; a gate electrode provided on the gate insulating film; a fourth semiconductor region of the second conductivity type, provided in the intermediate region, between the first main surface of the semiconductor substrate and the second semiconductor region, the fourth semiconductor region having an impurity concentration that is higher than that of the second semiconductor region; a field oxide film provided in the intermediate region, on the gate insulating film at the first main surface of the semiconductor substrate; a gate polysilicon wiring layer surrounding the periphery of the active region and provided on the field oxide film, the gate polysilicon wiring layer having an outer end and an inner end opposite to the outer end and closer than the outer end to a center of the semiconductor substrate in a plan view of the semiconductor device, and being connected to the gate electrode at the inner end, the gate polysilicon wiring layer facing the fourth semiconductor region in a depth direction with the field oxide film and the gate insulating film intervening therebetween, wherein the gate polysilicon wiring layer extends closer to the center of the silicon carbide semiconductor device than does the field oxide film, the gate polysilicon wiring layer having an inner end portion that faces the fourth semiconductor region in the depth direction with the gate insulating film intervening therebetween; an interlayer insulating film covering the gate electrode and the gate polysilicon wiring layer; a contact hole penetrating through the interlayer insulating film in the depth direction and exposing the first main surface of the semiconductor substrate; a first electrode electrically connected to the second semiconductor region, the plurality of third semiconductor regions, and the fourth semiconductor region, via the contact hole; a second electrode provided on the second main surface of the semiconductor substrate; and a first low carrier lifetime region containing a first carrier lifetime killer provided in a portion of the intermediate region adjacent to one corner of the active region, the first low carrier lifetime region facing the gate polysilicon wiring layer in the depth direction and overlapping the fourth semiconductor region in the plan view.

Objects, features, and advantages of the present invention are specifically set forth in or will become apparent from the following detailed description of the invention when read in conjunction with the accompanying drawings.

DETAILED DESCRIPTION OF THE INVENTION

Figure 11:
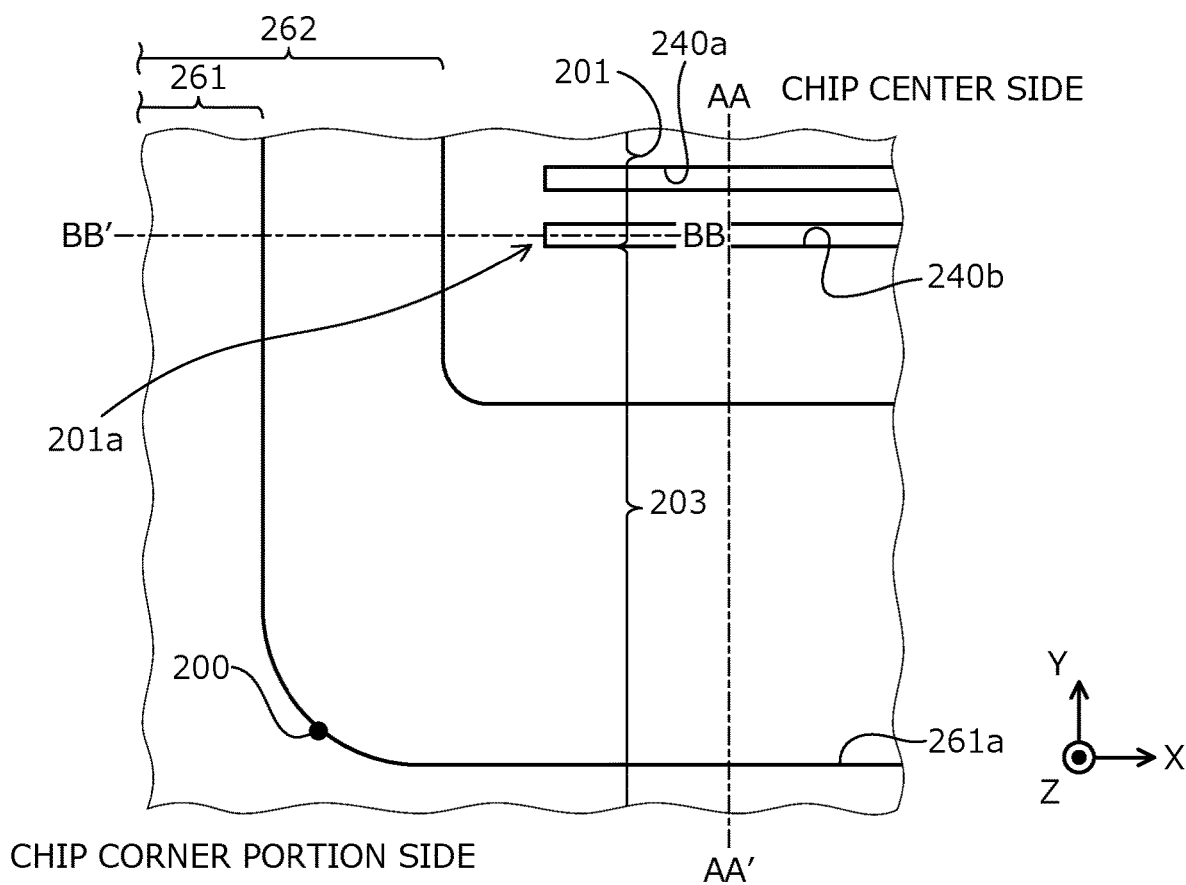
FIG. 11 is a plan view of a portion of a layout when a conventional silicon carbide semiconductor device is viewed from a front side of a semiconductor substrate.
Figure 12:
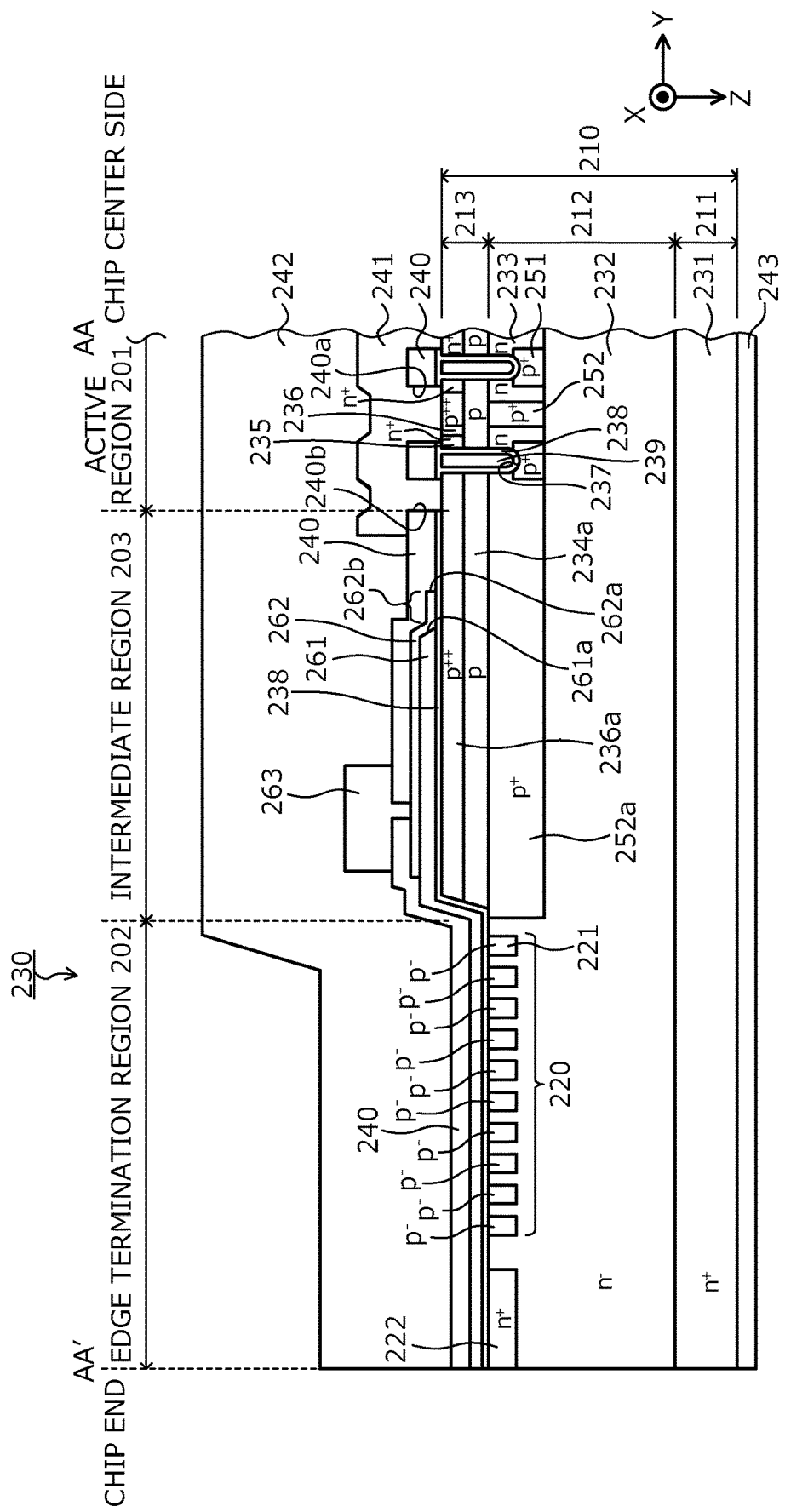
FIG. 12 is a cross-sectional view of a structure along cutting line AA-AA' in FIG. 11.
Figure 13:
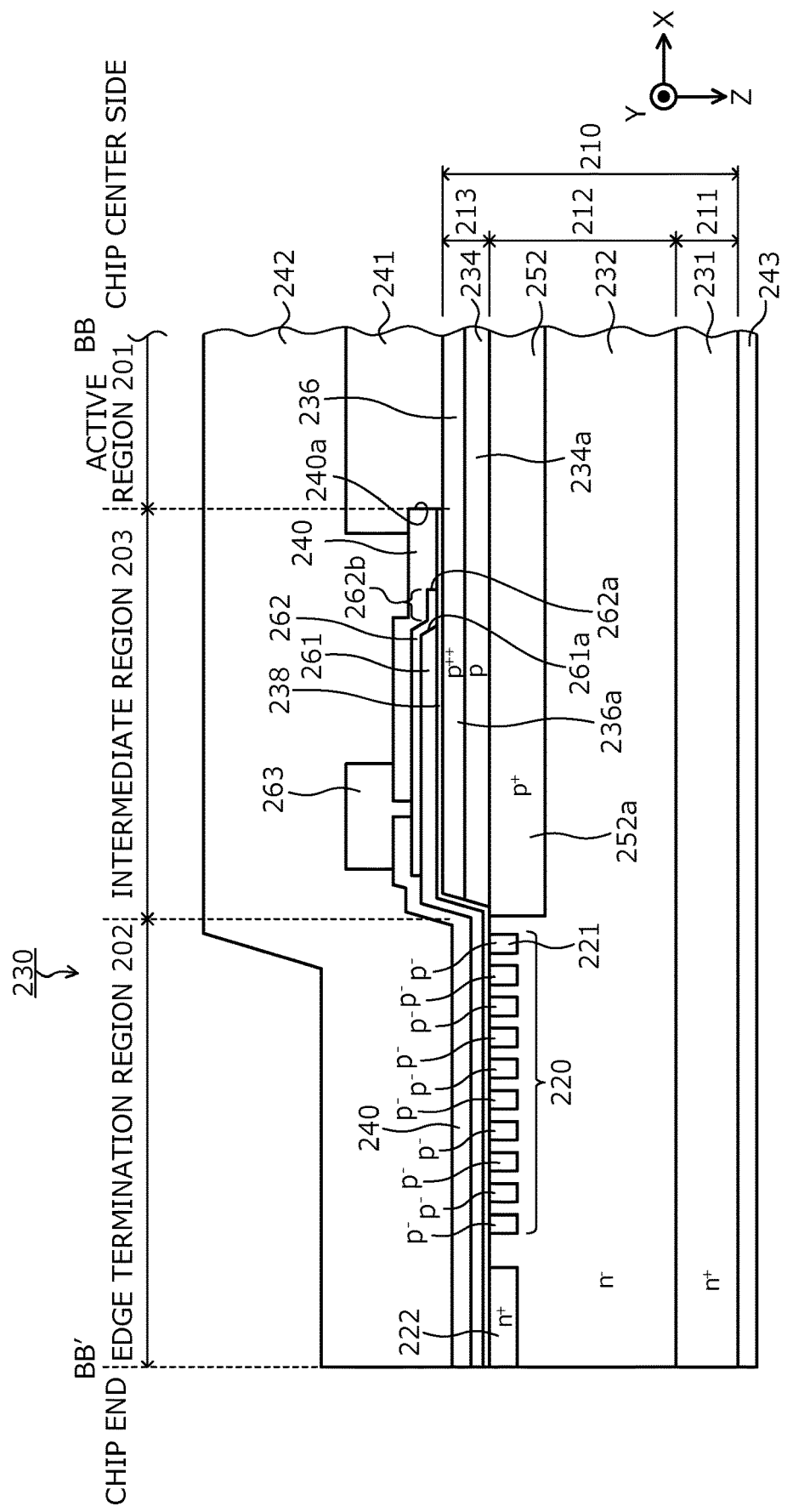
FIG. 13 is a cross-sectional view of the structure along cutting line BB-BB' in FIG. 11.

First, problems associated with the conventional techniques are discussed. The above-described conventional silicon carbide semiconductor device 230 (SiC-MOSFET, refer to FIGS. 11 to 13) has a structure in which the gate polysilicon wiring layer 262 and the gate electrodes 239 are connected and therefore, the chip-center portion 262b of the gate polysilicon wiring layer 262 faces the semiconductor substrate 210 in the depth direction Z, with only the gate insulating film 238 that has a thickness thinner than that of the field oxide film 261 intervening therebetween. Thus, parasitic capacitance formed by electrostatic capacitance of the gate insulating film 238 and space charge capacitance of a SiC portion (the semiconductor substrate 210) being connected in series is formed directly beneath the chip-center portion 262b of the gate polysilicon wiring layer 262.

The SiC portion directly beneath the chip-center portion 262b of the gate polysilicon wiring layer 262 is a p-type region (the $p^{++}$-type contact extension portion 236a, the p-type base extension portion 234a, and the $p^+$-type extension portion 252a). Therefore, similarly as electrons and holes, respectively, accumulate in the p-type base region 234 along the parasitic capacitance due to the electrostatic capacitance of the gate insulating film 238 at sidewalls of the gate trenches 237 when the SiC-MOSFET is on and when the SiC-MOSFET is off, electrons and holes also accumulate in the p-type region directly beneath the chip-center portion 262b of the gate polysilicon wiring layer 262, along the parasitic capacitance due to the electrostatic capacitance of the gate insulating film 238 on the front surface of the semiconductor substrate 210.

The electrons accumulated in the p-type region along the parasitic capacitance directly beneath the chip-center portion 262b of the gate polysilicon wiring layer 262 are discharged to the drain electrode 243 during the switching transition period from on to off of the SiC-MOSFET or during reverse recovery of the parasitic diode of the SiC-MOSFET. The holes accumulated in the p-type region along the parasitic capacitance directly beneath the chip-center portion 262b of the gate polysilicon wiring layer 262 flow in a direction toward the active region 201 during the switching transition period from off to on of the SiC-MOSFET and are pulled out from the contact holes 240a, 240b of the active region 201 to the source electrode 241.

Further, due to a steep dV/dt (variation of drain-source voltage per unit time) occurring during the switching transition period from on to off of the SiC-MOSFET, displacement current (hole current) is generated by the $n^-$-type drift region 232 of the edge termination region 202 and flows in a direction toward the active region 201. The displacement current flows from the $n^-$-type drift region 232 of the edge termination region 202, through the p⁺-type extension portion 252a and the p-type base extension portion 234a of the intermediate region 203, into the p⁺⁺-type contact extension portion 236a, and is pulled out from the contact holes 240a, 240b of the active region 201 to the source electrode 241.

Nonetheless, in the p-type region of the SiC portion, aluminum (Al) is used as an acceptor (p-type impurity), an energy level of Al is deep, 200 meV (i.e., ionization energy is high), and an activation rate of Al in SiC is low, whereby formation of a low-resistance p-type region is difficult. Therefore, parasitic resistance components of the p⁺⁺-type contact region 236, the p-type base region 234, and the p⁺-type regions 251, 252 in the active region 201, and parasitic resistance components of the p⁺⁺-type contact extension portion 236a, the p-type base extension portion 234a, and the p⁺-type extension portion 252a in the intermediate region 203 are extremely large. This phenomenon is prominent at low temperatures when AL, which has high ionization energy, ceases to function as an acceptor.

Holes accumulated in the intermediate region 203 and holes generated in the edge termination region 202 pass through the p⁺-type extension portion 252a, the p-type base extension portion 234a, and the p⁺⁺-type contact extension portion 236a, which have high resistance, and are pulled out to the source electrode 241, whereby voltage drops on paths of these holes increase. Voltage generated by these voltage drops is applied to the parasitic capacitance directly beneath the chip-center portion 262b of the gate polysilicon wiring layer 262, gate leak current that passes through the gate insulating film 238 and flows in direction toward the gate polysilicon wiring layer 262 is generated, dielectric breakdown withstand voltage of the gate insulating film 238 is exceeded at a location of concentration of the gate leak current, and the gate insulating film 238 dielectrically breaks down.

The hole current amount (gate leak current amount) leading to dielectric breakdown of the gate insulating film 238 is calculated by multiplying the switching transition period for the SiC-MOSFET to switch from on to off or from off to on or the steep dV/dt occurring with reverse recovery of the parasitic diode of the SiC-MOSFET, and the parasitic capacitance adjacent to the p-type regions constituting the paths of the holes. The parasitic capacitance formed directly beneath the chip-center portion 262b of the gate polysilicon wiring layer 262 when negative voltage is applied to the gate polysilicon wiring layer 262 is substantially equal to the electrostatic capacitance of the gate insulating film 238 because holes are accumulated in the SiC portion (p-type region) and depletion does not occur.

To suppress dielectric breakdown of the gate insulating film 238, adjusting and increasing gate resistance Rg so that the switching transition period of the SiC-MOSFET or the dV/dt occurring with reverse recovery of the parasitic diode of the SiC-MOSFET decreases, and setting the hole current amount of the paths of the holes to be smaller may be considered, however, switching loss increases proportionately to the increase in the gate resistance Rg and therefore, characteristics of SiC are not sufficiently utilized. Further, to maintain total conduction loss of the SiC-MOSFET, increasing the chip size and reducing forward loss to compensate for the increase in switching loss leads to increases in cost.

It was confirmed by the inventor that dielectric breakdown of the gate insulating film 238, in particular, in the gate insulating film 238 (portion of an insulating layer directly beneath the gate polysilicon wiring layer 262 and having a thin thickness) directly beneath the chip-center portion 262b of the gate polysilicon wiring layer 262, dielectric breakdown occurs at a location (near the chip-center end 261a of the field oxide film 261) that is a starting point side of the hole current that flows in a direction toward the active region 201. Further, the inventor confirmed that the dielectric breakdown of the gate insulating film 238 occurs only in the corners (vertices) 201a of the active region 201, which has a substantially rectangular shape in a plan view, and dV/dt capability at the corners 201a is lower compared to that at a linear portion (edge) of the active region 201.

Further, from an image of emission obtained by an emission microscope (EMS), the inventor confirmed that the gate insulating film 238 dielectrically breaks down at a location where this hole current concentrates and hole current concentrates (is emitted) at a portion where the gate polysilicon wiring layer forms substantially a 90 angle such as at a portion of the gate polysilicon wiring layer 262 (portion indicated by a black point 200 in FIG. 11) near the corner 201a of the active region 201, a location connecting the gate polysilicon wiring layer 262 and a gate polysilicon wiring layer (not depicted) of the gate pad, a location connecting the gate polysilicon wiring layers of the gate pad and an electrode pad for measuring gate resistance (not depicted), etc.

Embodiments of a silicon carbide semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
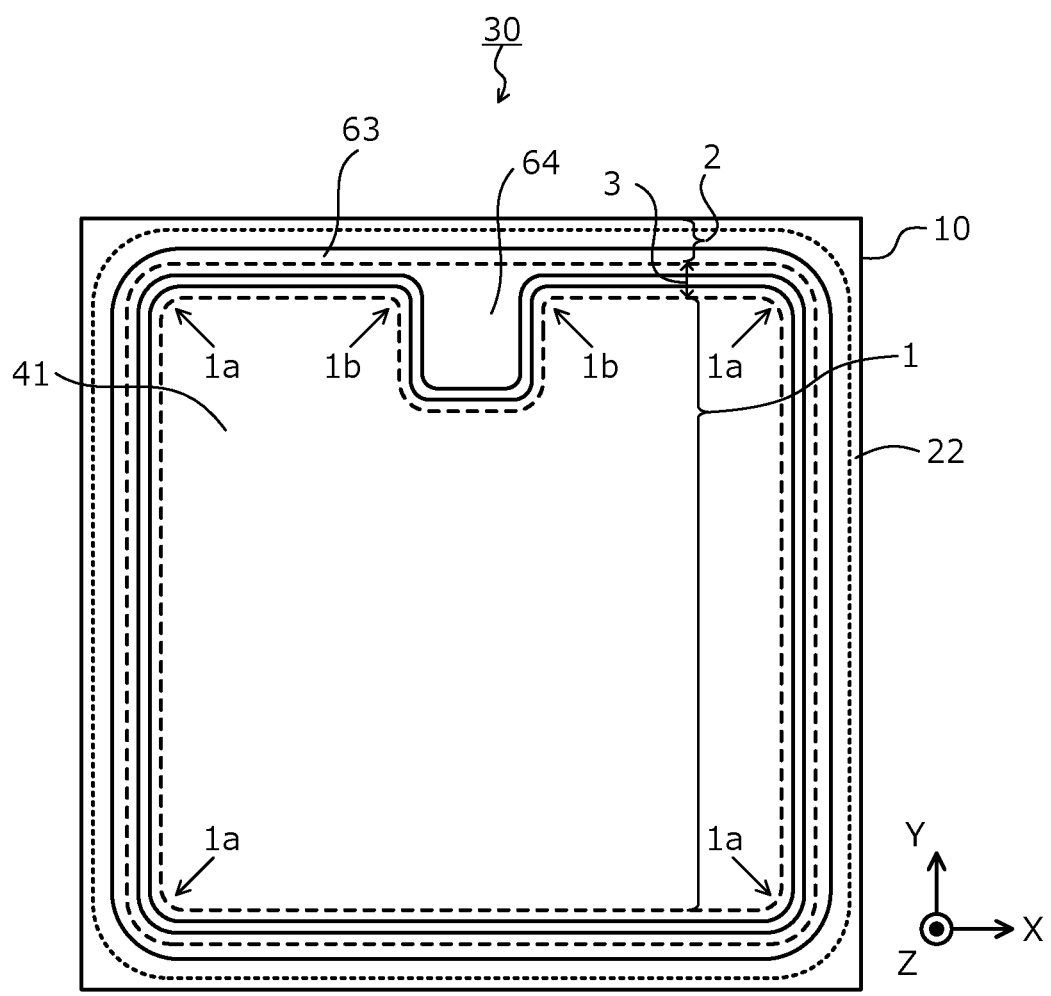
FIG. 1 is a plan view depicting a layout when a silicon carbide semiconductor device according to a first embodiment is viewed from a front side of a semiconductor substrate.
Figure 2:
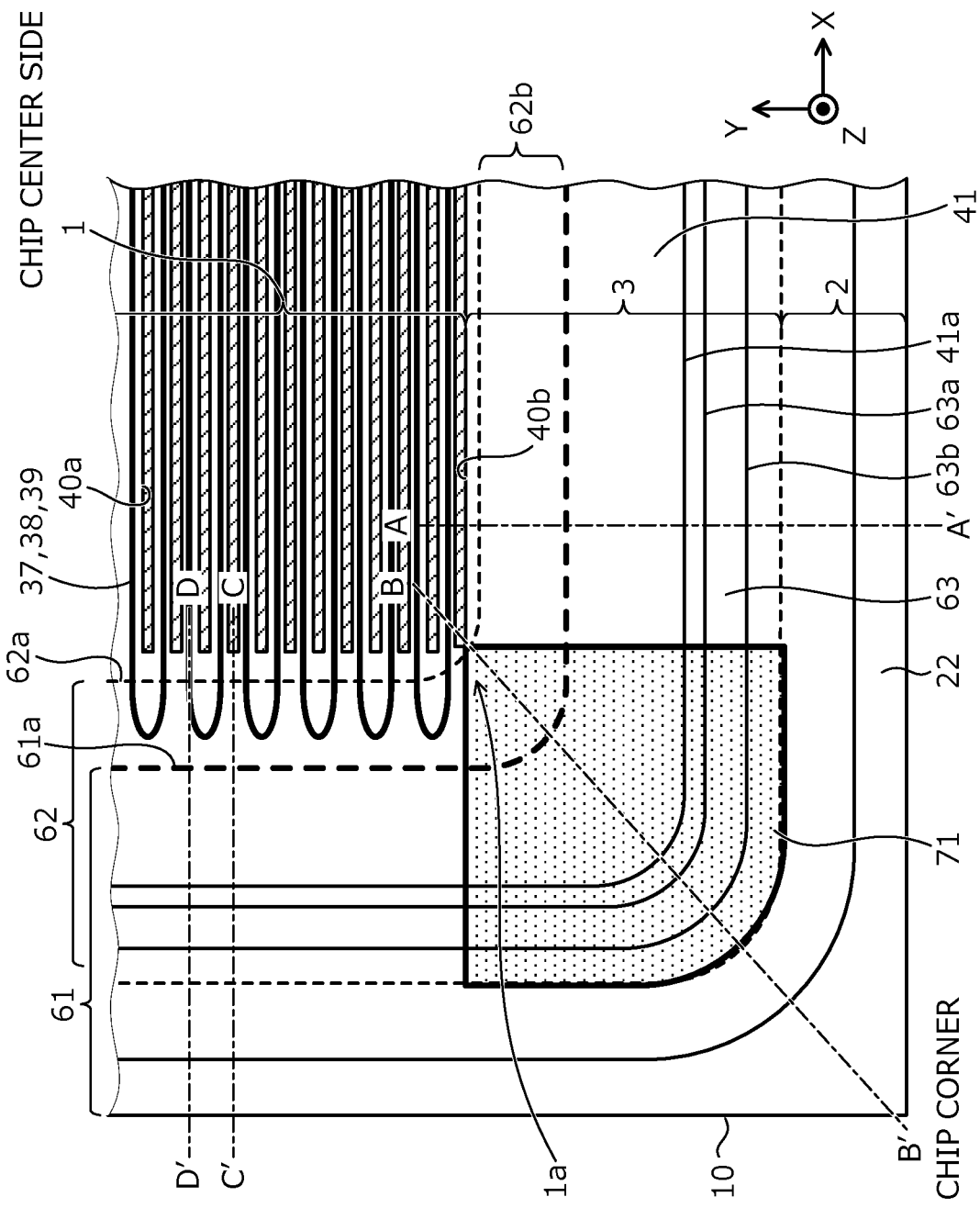
FIG. 2 is an enlarged view of a portion near a corner portion of the semiconductor substrate in FIG. 1.
Figure 3:
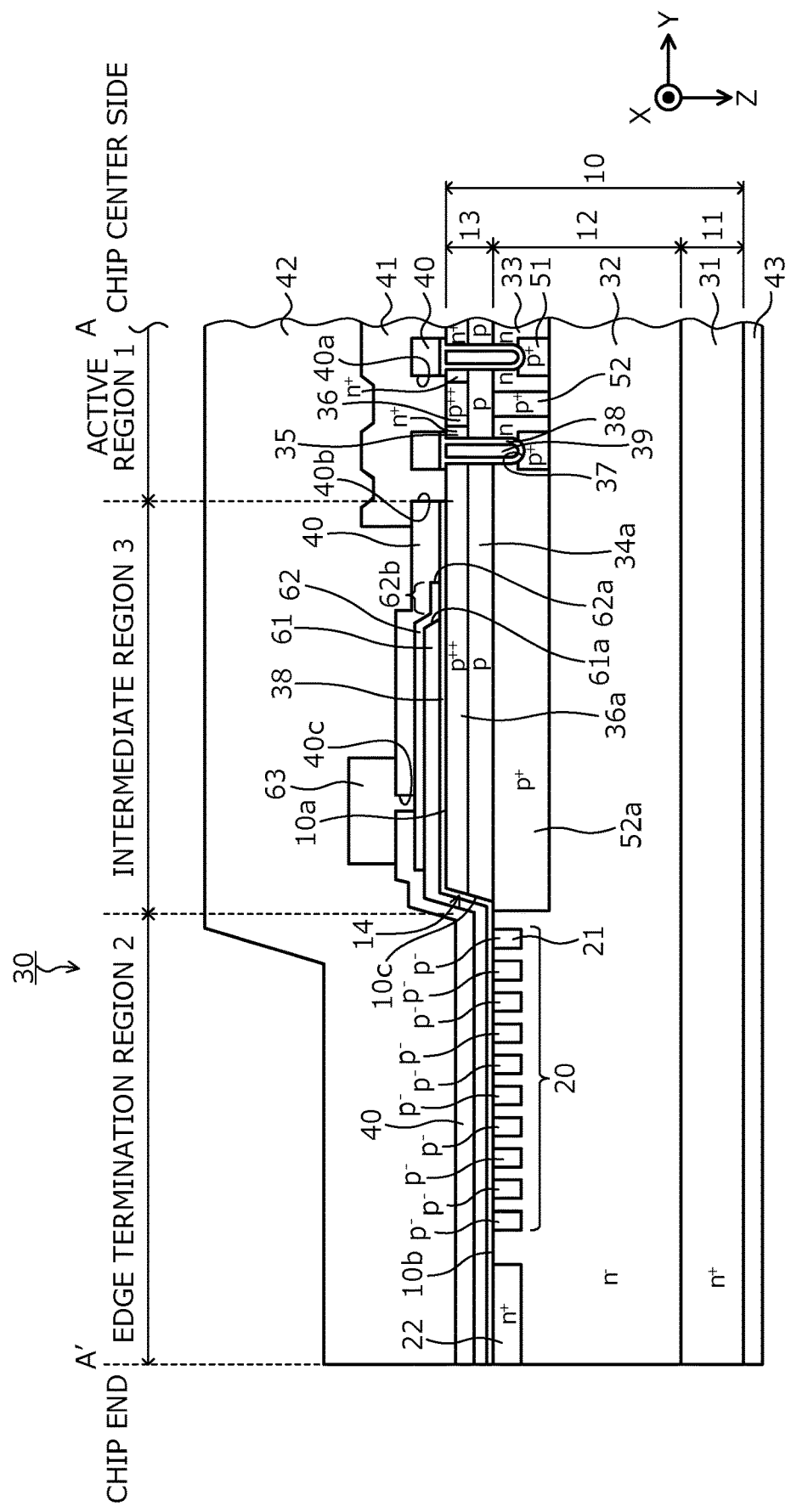
FIG. 3 is a cross-sectional view of a structure along cutting line A-A' in FIG. 2.
Figure 4:
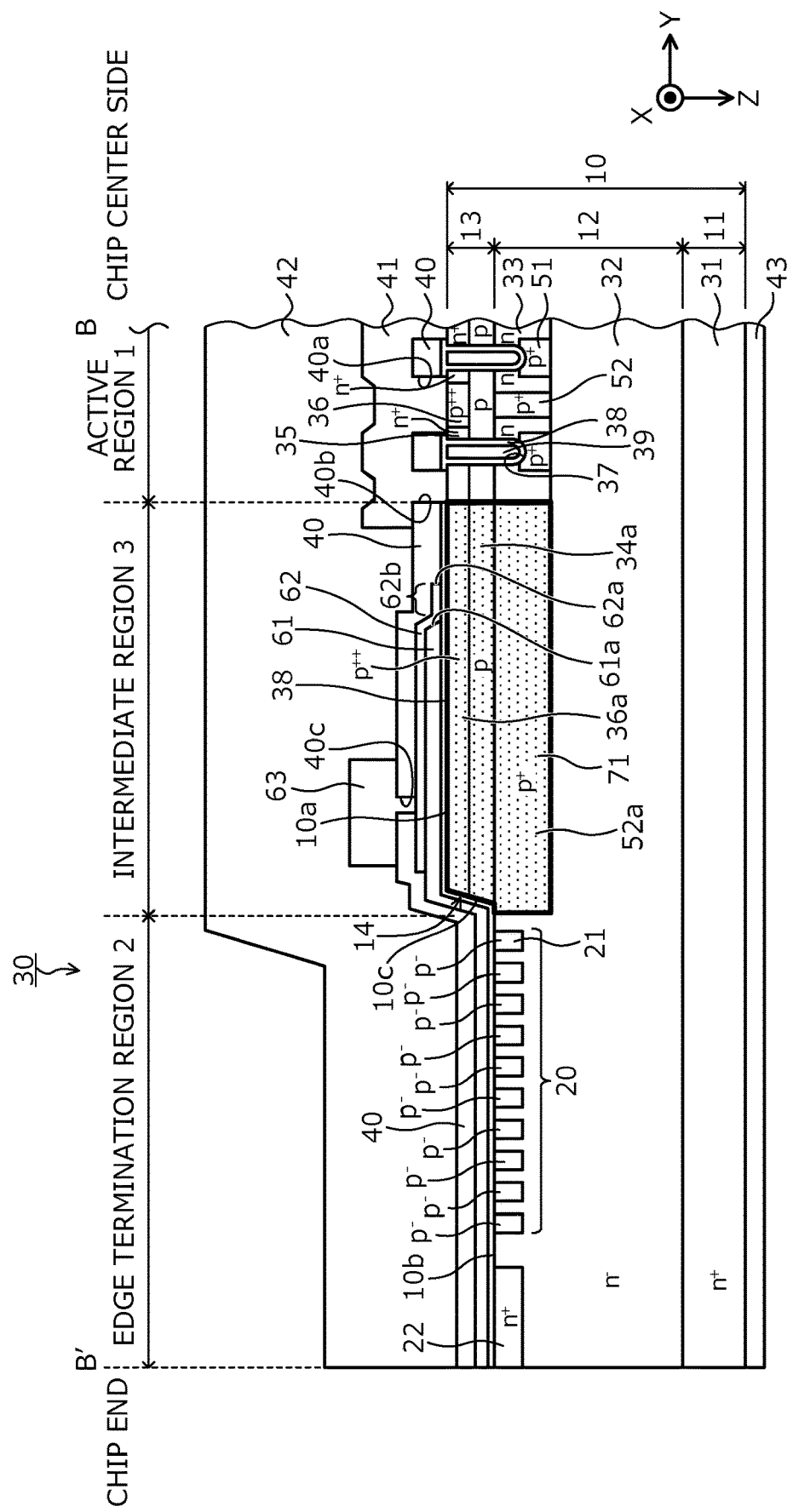
FIG. 4 is a cross-sectional view of the structure along cutting line B-B' in FIG. 2.
Figure 5:
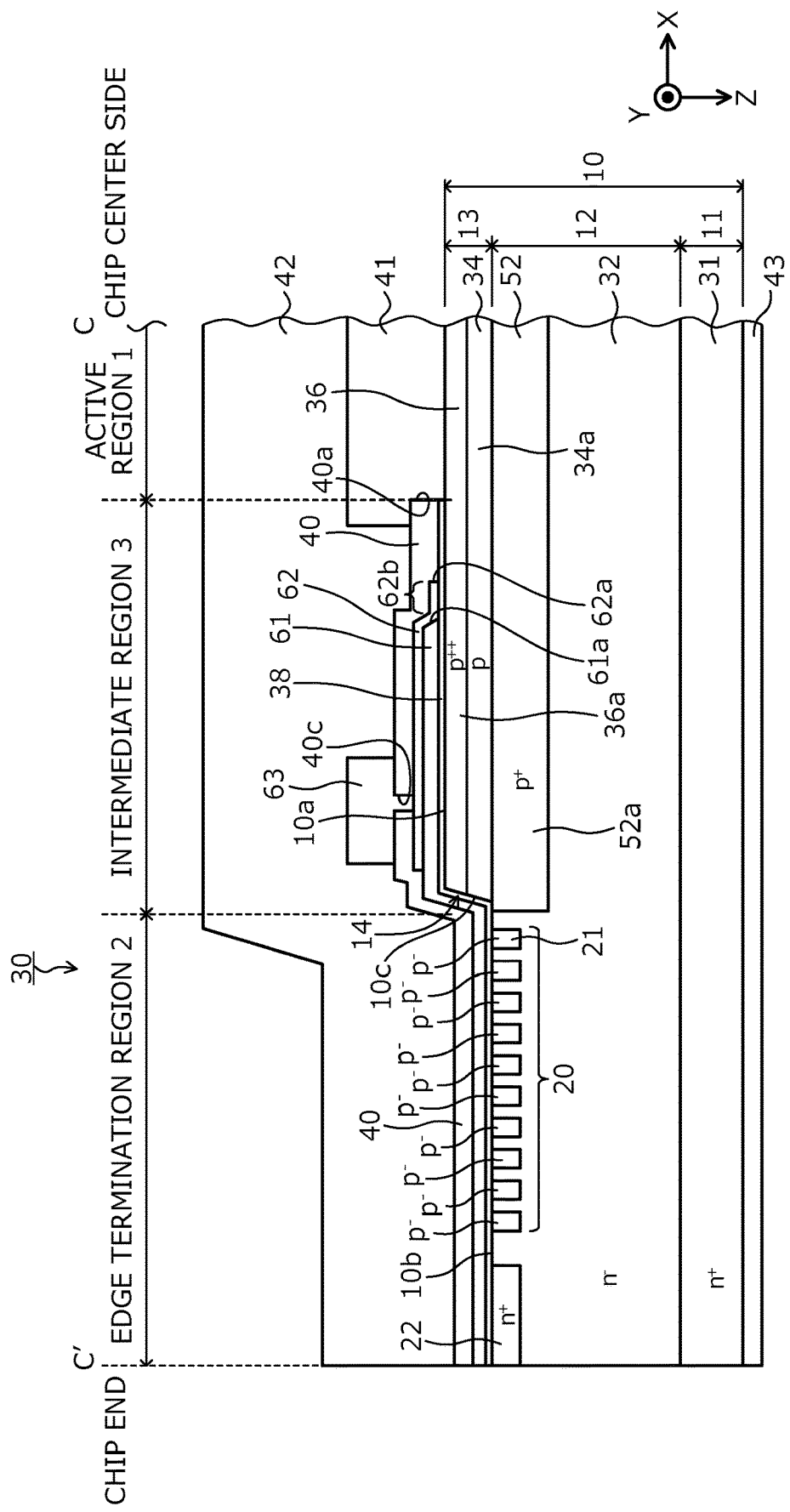
FIG. 5 is a cross-sectional view of the structure along cutting line C-C' in FIG. 2.
Figure 6:
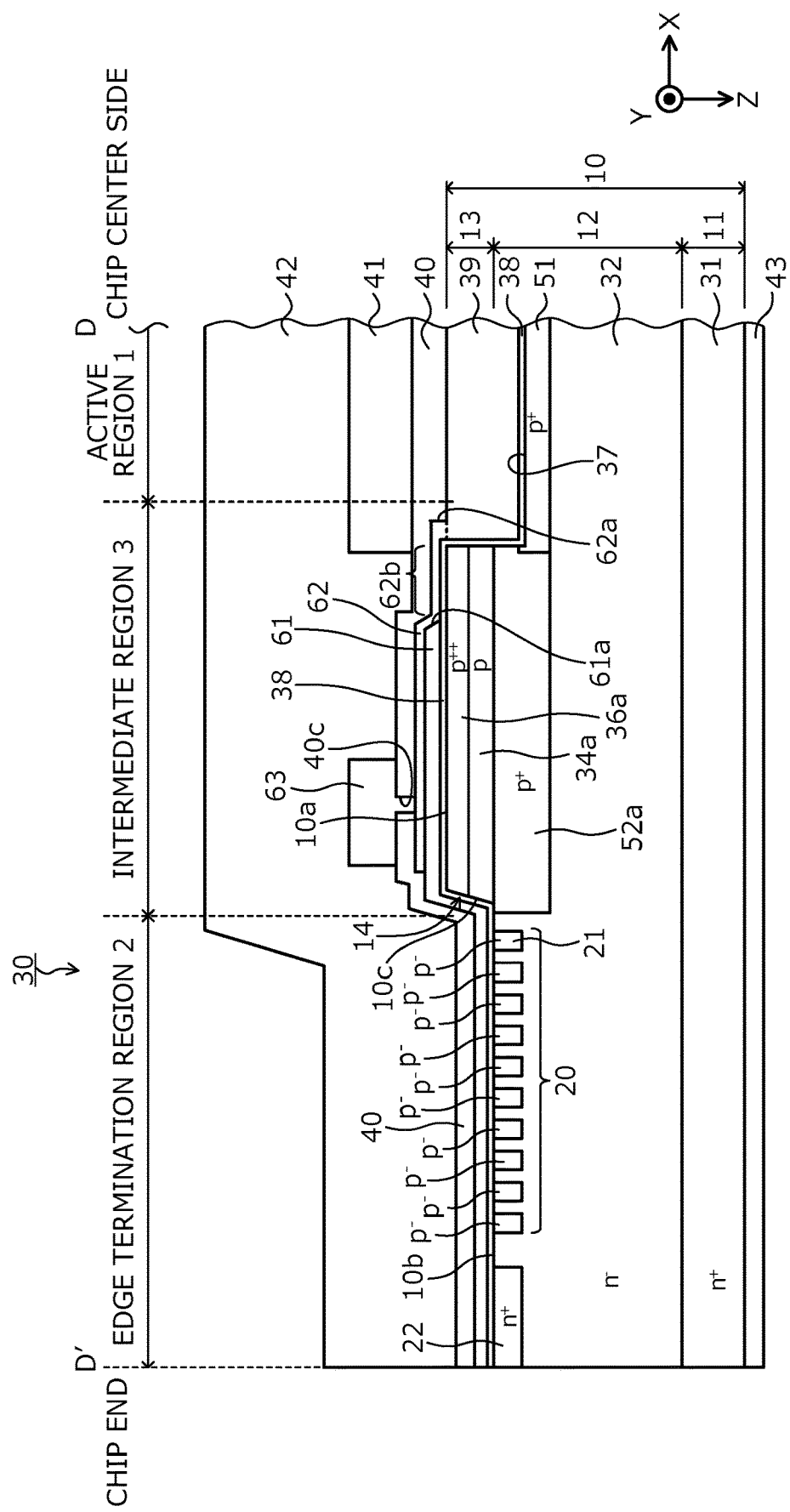
FIG. 6 is a cross-sectional view of the structure along cutting line D-D' in FIG. 2.
Figure 7:
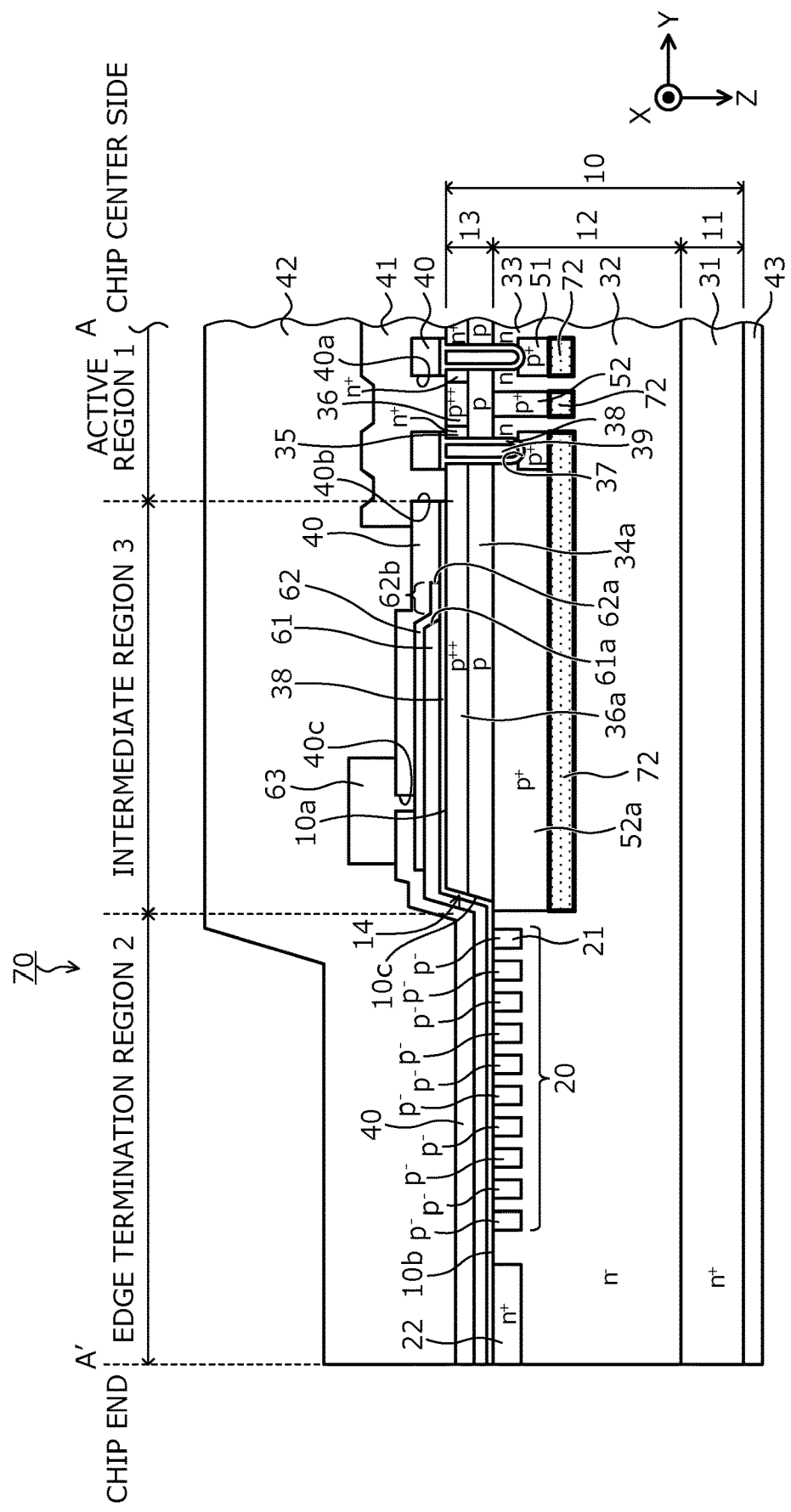
FIG. 7 is a cross-sectional view of a structure of a silicon carbide semiconductor device according to a second embodiment.
Figure 8:
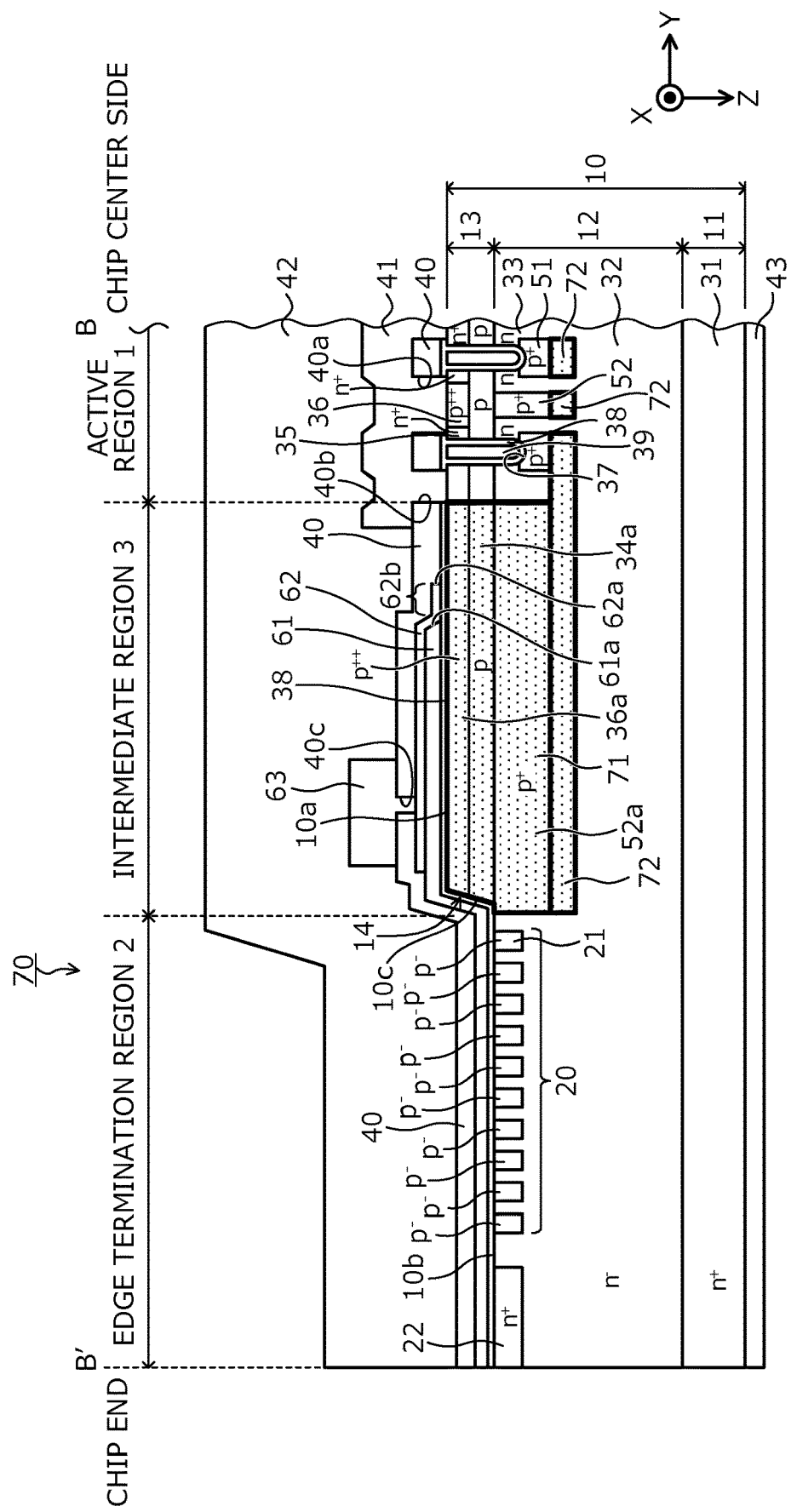
FIG. 8 is a cross-sectional view of the structure of the silicon carbide semiconductor device according to the second embodiment.
Figure 9:
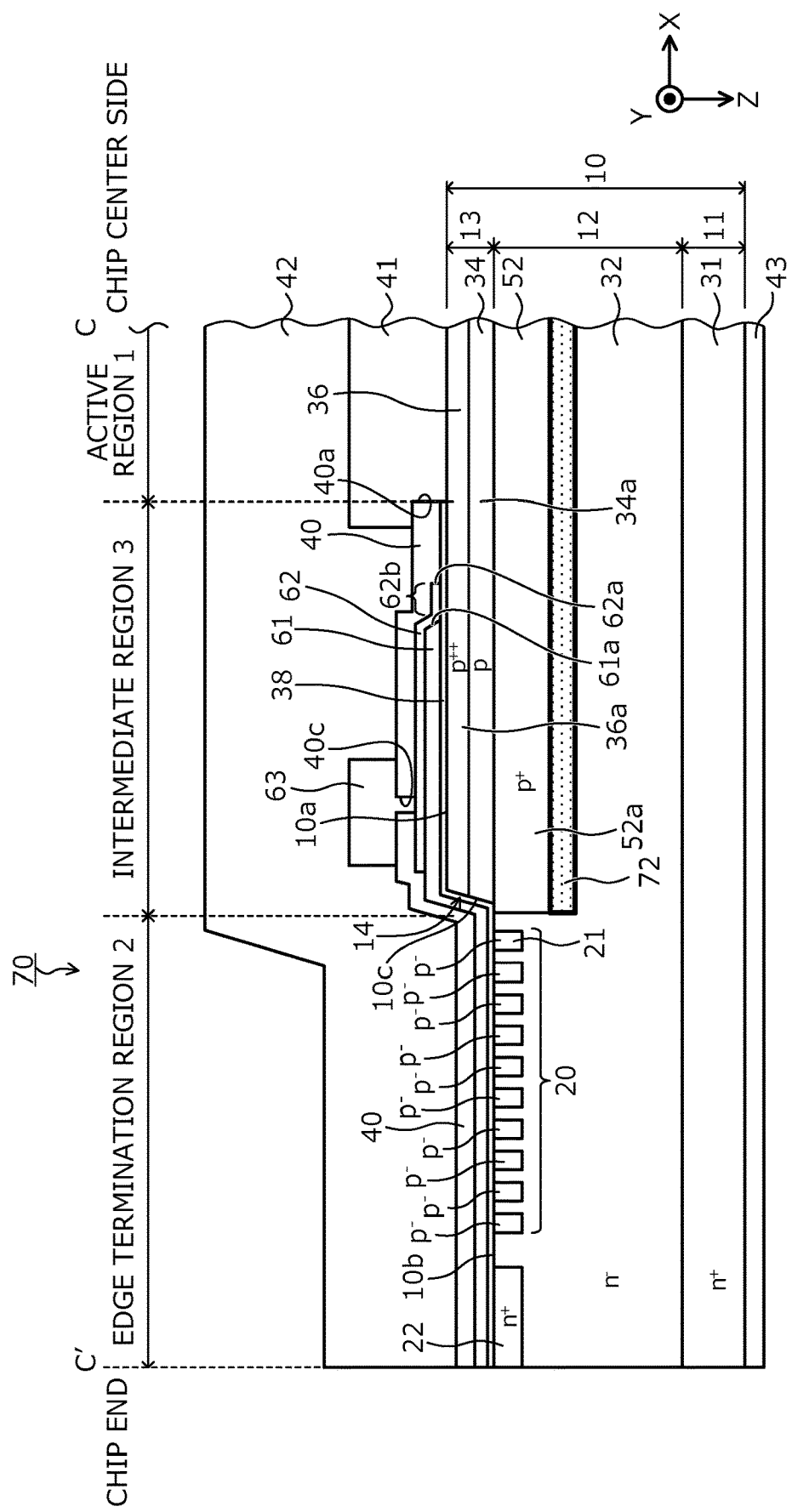
FIG. 9 is a cross-sectional view of the structure of the silicon carbide semiconductor device according to the second embodiment.
Figure 10:
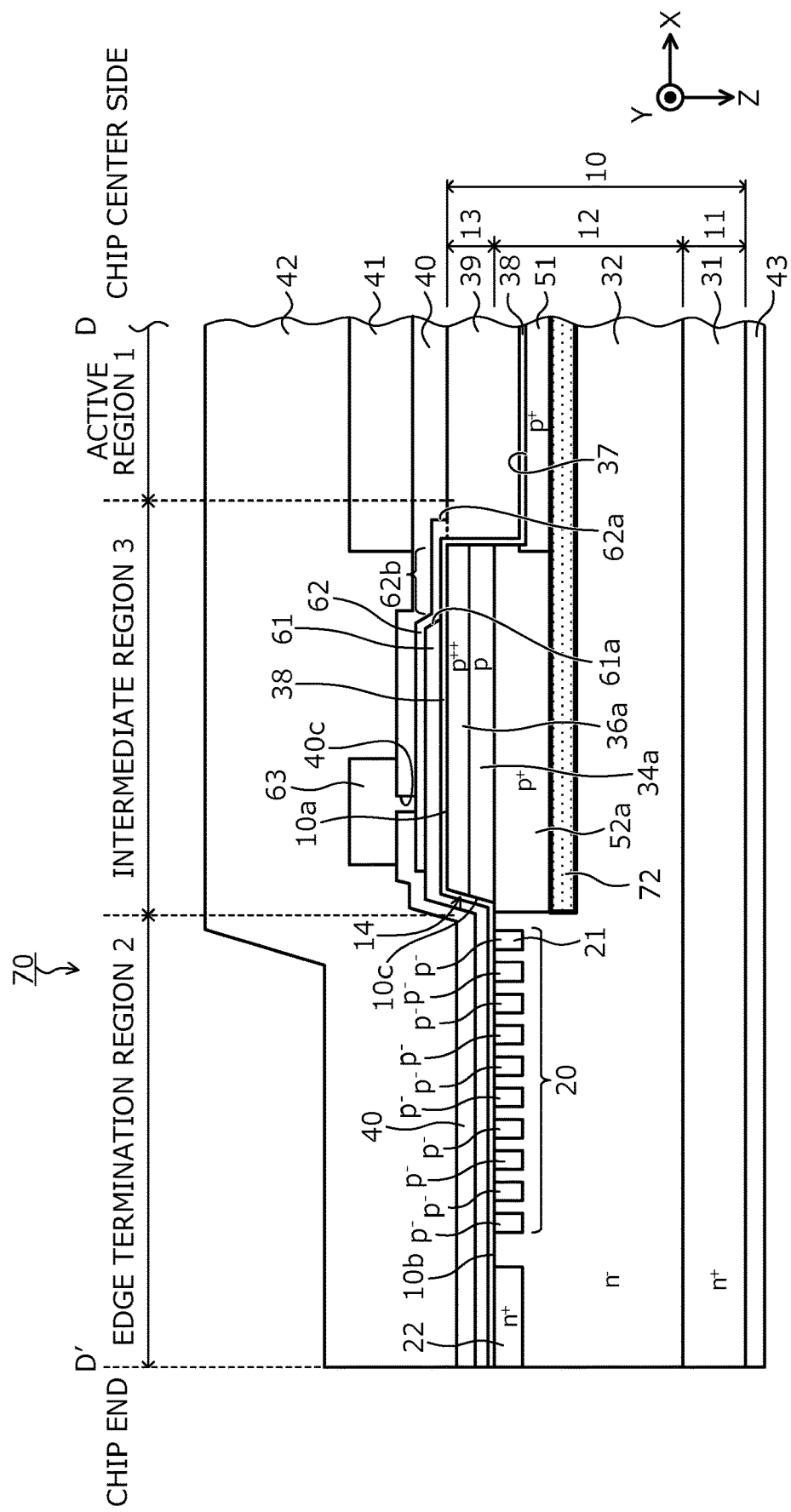
FIG. 10 is a cross-sectional view of the structure of the silicon carbide semiconductor device according to the second embodiment.

A structure of a silicon carbide semiconductor device according to a first embodiment is described. FIG. 1 is a plan view depicting a layout when the silicon carbide semiconductor device according to the first embodiment is viewed from a front side of a semiconductor substrate. In FIG. 1, coarsely broken lines are a border between an active region 1 and an intermediate region 3, and a border between the intermediate region 3 and an edge termination region 2, while a finely broken line is an inner periphery of an n⁺-type channel stopper region 22 provided along an outer periphery of a semiconductor substrate (semiconductor chip) 10 that has a substantially rectangular shape in a plan view of the silicon carbide semiconductor device. An outer periphery of the n⁺-type channel stopper region 22 is an outer periphery of the semiconductor substrate 10. FIG. 2 is an enlarged view of a portion near a corner portion of the semiconductor substrate in FIG. 1 (portion including a vertex (chip corner) of the semiconductor substrate that has a substantially rectangular shape in a plan view of the silicon carbide semiconductor device).

In FIG. 2, a gate trench 37, a gate insulating film 38, and a gate electrode 39 are collectively indicated by a single thick line, contact holes 40a, 40b in the active region 1 are indicated with hatching. An inner periphery (a chip-center end (inner end) 61a) of a field oxide film 61 is indicated by a coarsely broken line while an inner periphery (a chip-center end (inner end) 62a) and an outer periphery of a gate polysilicon (poly-Si) wiring layer 62 are indicated by finely broken lines. An outer periphery of the field oxide film 61 is the outer periphery of the semiconductor substrate 10. Reference character 41a is an outer periphery of a source electrode 41, reference characters 63a and 63b are an inner periphery and an outer periphery of a gate metal wiring layer 63, respectively. FIGS. 3, 4, 5, and 6 are cross-sectional views of the structure along cutting line A-A', cutting line B-B', cutting line C-C', and cutting line D-D' in FIG. 2.

A silicon carbide semiconductor device 30 according to the first embodiment depicted in FIGS. 1 to 6 is a vertical SiC-MOSFET with a trench structure and the active region 1 and the edge termination region 2 on the semiconductor substrate (semiconductor chip) 10 that contains silicon carbide (SiC). The active region 1 is a region in which a main current (drift current) flows when the MOSFET is on and in which multiple unit cells (constituent units of a device element) of the MOSFET are disposed, each of the unit cells having the same structure. The active region 1 has a substantially rectangular shape in a plan view of the silicon carbide semiconductor device and is disposed in substantially a center (chip center) of the semiconductor substrate 10. At each corner (vertex) 1a of the active region 1, corners of the source electrode 41, the gate polysilicon wiring layer 62, and the gate metal wiring layer 63 may be chamfered to be substantially curved.

The active region 1 is a region that is further inward (closer to the chip center) in the later-described direction X (the longitudinal direction of the gate trenches 37), than are longitudinal ends of the later-described contact holes 40a, 40b, the longitudinal ends being the ends in the longitudinal direction. The active region 1 is a region that is closer to the chip center than is a side surface of an insulating layer (an interlayer insulating film 40 and the gate insulating film 38) that forms a chip-end sidewall of each of the contact holes 40b that are outermost (closest to an end of the semiconductor substrate 10 (the chip end)) in the later-described second direction Y (traverse direction of the gate trenches 37). Longitudinal ends of the contact holes 40a, 40b of the active region 1 (the ends in the longitudinal direction) are side surfaces of the insulating layer (the interlayer insulating film 40 and the gate insulating film 38) that forms sidewalls of the contact holes 40a, 40b.

In the active region 1, the source electrode (first electrode) 41, which has substantially the same shape in a plan view and substantially the same surface area as those of the active region 1 is provided on the front surface of the semiconductor substrate 10. The source electrode 41 has a portion exposed in an opening of a passivation film 42 (refer to FIGS. 3 to 6) and the portion functions as a source pad (electrode pad). A gate pad (electrode pad) 64 is disposed in the active region 1 or in the intermediate region 3. In FIG. 1, while the gate pad 64 having, in a plan view, a substantially rectangular shape with chamfered corner portions is disposed in the intermediate region 3, and the active region 1 and the source electrode 41 are depicted having, in a plan view, a substantially rectangular shape with a recessed portion recessed toward the chip center so as to surround three edges of the gate pad 64, shapes of these parts, in a plan view, are suitably set.

The intermediate region 3 between the active region 1 and the edge termination region 2 is adjacent to the active region 1 and surrounds the periphery of the active region 1 in a substantially rectangular shape. A border between the intermediate region 3 and the edge termination region 2 is an outer end (end closest to a chip end) of a later-described $p^+$-type extension portion 52a. The gate pad 64 and, the gate polysilicon wiring layer 62 and the gate metal wiring layer 63 constituting the gate runner are provided in the intermediate region 3. The gate pad 64, similarly to the gate runner, is formed by a non-depicted gate polysilicon wiring layer and a gate metal wiring layer that are sequentially stacked in the order stated. The gate electrodes 39 of the unit cells of the SiC-MOSFET are electrically connected to the gate pad 64, via the gate runner. The gate runner surrounds the periphery of the active region 1 in a substantially rectangular shape.

In the intermediate region 3, only in portions thereof (hereinafter, corner portions of the intermediate region 3) adjacent to the corners 1a of the active region 1, carrier lifetime killers (crystal defects that are trapping centers of minority carriers) are introduced, whereby low carrier lifetime regions 71 (hatched portion, first low carrier lifetime regions) in which the lifetime of minority carriers (holes) is shorter than that in other portions in the semiconductor substrate 10 are provided (refer to FIG. 2). The intermediate region 3 surrounds the periphery of the active region 1 in a substantially rectangular shape and has linear portions that are orthogonal to each other; each of the low carrier lifetime regions 71 has, in a plan view, for example, a substantially linear shape, a substantially fan-like shape, or an arc shape that connects the orthogonal linear portions of the intermediate region 3. The low carrier lifetime region 71 does not face the active region 1 in the first direction X or in the second direction Y. The linear portions of the intermediate region 3, the active region 1, and the edge termination region 2 are free of the low carrier lifetime region 71.

On paths of holes when the holes generated in the intermediate region 3 and the edge termination region 2 are pulled out to the source electrode 41, the holes pass through the linear portions of the intermediate region 3 and through an entire area of the outermost contact holes 40b of the active region 1 or all the longitudinal ends of the contact holes 40a, 40b in the active region 1, and then out the source electrode 41. The linear portions of the intermediate region 3 are portions that correspond to the four edges of the intermediate region 3 and face the active region 1 in the first direction X or the second direction Y. On the other hand, the holes that pass through one of the corner portions of the intermediate region 3, for example, pass through only the longitudinal ends of the outermost contact holes 40b of the active region 1 and then out the source electrode 41. Therefore, a hole path passing through a corner portion of the intermediate region 3 is narrow compared to a hole path passing through a linear portion of the intermediate region 3. As a result, even though the amount of holes is greater at the corner portions of the semiconductor substrate 10 than at the linear portions (edges) of the semiconductor substrate 10, the hole current is concentrated on narrow paths at the corner portions of the semiconductor substrate 10, whereby potential tends to rise.

Thus, in the first embodiment, as described above, the low carrier lifetime region 71 is disposed in the corner portions of the intermediate region 3. On the paths of holes when the holes generated in the intermediate region 3 and the edge termination region 2 are pulled out to the source electrode 41, the low carrier lifetime region 71 has a function of shortening the average time until the holes flowing in a direction of one of the corners 1a of the active region 1 disappear as compared to the average time until the holes flowing in a direction of a linear portion (edge) of the active region 1 disappear. The low carrier lifetime region 71 is disposed in the corner portions of the intermediate region 3, whereby hole density on the paths of the holes that flow from the intermediate region 3 and the edge termination region 2 in a direction toward the active region 1 and are pulled out to the source electrode 41 is adjusted to be substantially equal across an entire area of the intermediate region 3.

The low carrier lifetime region 71 is disposed at least directly beneath the gate polysilicon wiring layer 62. A reason for this is that holes generated by the intermediate region 3 and the edge termination region 2 pass through the SiC portion (the semiconductor substrate 10) directly beneath the gate polysilicon wiring layer 62 and flow in a direction toward the active region 1, whereby the potential at the SiC portion directly beneath the gate polysilicon wiring layer 62 tends to rise. Further, the low carrier lifetime region 71 may reach a later-described third surface portion 10c (outer end of a later-described p-type region that overlaps the low carrier lifetime region 71) of the front surface of the semiconductor substrate 10. As a result, the holes that are generated in the intermediate region 3 and the edge termination region 2 and flow in a direction toward the active region 1 may be trapped and caused to disappear as close as possible to the chip end by the carrier lifetime killer in the low carrier lifetime region 71, whereby the hole density near the corners 1a of the active region 1 may be reduced.

As an impurity constituting the carrier lifetime killer introduced into the low carrier lifetime region 71, an impurity generally used as a carrier lifetime killer in an insulated gate bipolar transistor (IGBT), a diode, etc. may be used, in particular, for example, helium (He), protons ($H^+$), vanadium (V), etc. may be used. In the low carrier lifetime region 71, the carrier lifetime killer is introduced at a dose amount in a range of, for example, about $1\times10^{11}/cm^2$ to $1\times10^{12}/cm^2$ so that the impurity concentration exhibits a box profile. The carrier lifetime killer concentration (impurity concentration) of the low carrier lifetime region 71 is the highest in the semiconductor substrate 10.

The edge termination region 2 is a region between the active region 1 and the chip end, surrounds the periphery of the active region 1 via the intermediate region 3, mitigates electric field of the front side of the semiconductor substrate 10, and sustains a breakdown voltage. The breakdown voltage is a voltage limit at which voltage between the source and drain does not further increase even when avalanche breakdown occurs due to the pn junctions and current between the source and drain increases. In the edge termination region 2, a voltage withstanding structure such as a junction termination extension (JTE) structure, a field limiting ring (FLR) structure 20, etc. is disposed. Electric field of the edge termination region 2 is mitigated or dispersed by the voltage withstanding structure.

The semiconductor substrate 10 is formed by sequentially forming by epitaxial growth on a front surface of an $n^+$-type starting substrate 11 containing silicon carbide, epitaxial layers 12, 13 constituting an $n^-$-type drift region (first semiconductor region) 32 and a p-type base region (second semiconductor region) 34. The semiconductor substrate 10 has a main surface having the p-type epitaxial layer 13 assumed to be a front surface (first main surface) and a main surface having the $n^+$-type starting substrate 11 assumed to be a back surface (second main surface). The $n^+$-type starting substrate 11 constitutes an $n^+$-type drain region 31. A portion of the p-type epitaxial layer 13 in the edge termination region 2 is removed, thereby forming a drop 14 at the front surface of the semiconductor substrate 10.

The front surface of the semiconductor substrate 10 has, in the active region 1 and the intermediate region 3, a portion (hereinafter, first surface portion) 10a bordered by the drop 14, and a portion (hereinafter, second surface portion) 10b in the edge termination region 2, the second surface portion 10b being recessed and closer to the $n^+$-type drain region 31 in the depth direction Z than is the first surface portion 10a. The second surface portion 10b of the front surface of the semiconductor substrate 10 is a surface of the $n^-$-type epitaxial layer 12 exposed by removing the p-type epitaxial layer 13. A portion (third surface portion: mesa edge of the drop 14) 10c of the front surface of the semiconductor substrate 10 connecting the first surface portion 10a and the second surface portion 10b is a side surface of the p-type epitaxial layer 13 exposed by removing the p-type epitaxial layer 13.

In the active region 1, the trench structure configured by the p-type base region 34, $n^+$-type source regions (third semiconductor regions) 35, $p^{++}$-type contact regions 36, the gate trenches 37, the gate insulating film 38, and the gate electrodes 39 is provided at the first surface portion 10a of the front surface of the semiconductor substrate 10. The gate trenches 37 extend in a linear shape to the intermediate region 3 in the first direction X (longitudinal direction) that is parallel to the front surface of the semiconductor substrate 10. The gate trenches 37 are disposed in a striped pattern, adjacent to one another in the second direction Y (traverse direction) that is parallel to the front surface of the semiconductor substrate 10 and orthogonal to the first direction X.

The gate trenches 37 are disposed so as to be adjacent to one another in the second direction Y, whereby the unit cells each having the same structure are disposed adjacently in the second direction Y. The gate trenches 37 may be disposed so that, in a plan view, ends of the gate trenches 37 that are adjacent to each other, for example, are connected in an arc shape so as to form a ring shape surrounding the portion between the gate trenches 37 that are adjacent to each other (refer to FIG. 2). The gate trenches 37 penetrate through the p-type epitaxial layer 13 from the first surface portion 10a of the front surface of the semiconductor substrate 10 and reach the $n^-$-type epitaxial layer 12. The gate insulating film 38 is provided along inner walls of the gate trenches 37.

Further, the gate insulating film 38 extends from the inner walls of the gate trenches 37 onto the front surface of the semiconductor substrate 10 and on the front surface of the semiconductor substrate 10, reaches the chip end from the active region 1. The gate insulating film 38 has a thickness that is at least equal to a thickness by which a predetermined parasitic capacitance (the gate-source capacitance Cgs, the gate-drain capacitance Cgd) is obtained and, for example, is about 100 Å or greater. The gate electrodes 39 are provided on the gate insulating film 38 in the gate trenches 37 so as to be embedded in the gate trenches 37. The gate electrodes 39 are connected to the gate polysilicon wiring layer 62 at the longitudinal ends of the gate trenches 37.

The p-type base region 34, the $n^+$-type source regions 35, and the $p^{++}$-type contact regions 36 are selectively provided between each adjacent two of the gate trenches 37. The p-type base region 34 is a portion of the p-type epitaxial layer 13 excluding the $n^+$-type source regions 35, the $p^{++}$-type contact regions 36, and a later-described $p^{++}$-type contact extension portion 36a; the p-type base region 34 is in contact with the gate insulating film 38 at sidewalls of the gate trenches 37. The p-type base region 34 extends outward (in a direction toward the chip end) from the active region 1 and reaches the third surface portion 10c of the front surface of the semiconductor substrate 10. The p-type base region 34 is provided spanning the active region 1 and the intermediate region 3.

The $n^+$-type source regions 35 and the $p^{++}$-type contact regions 36 are selectively provided between the first surface portion 10a of the front surface of the semiconductor substrate 10 and the p-type base region 34, the $n^+$-type source regions 35 and the $p^{++}$-type contact regions 36 being in contact with the p-type base region 34 and exposed at the first surface portion 10a of the front surface of the semiconductor substrate 10. Being exposed at the first surface portion 10a of the front surface of the semiconductor substrate 10 means being in contact with the source electrode 41, at the first surface portion 10a of the front surface of the semiconductor substrate 10. The n$^+$-type source regions 35 are in contact with the gate insulating film 38 at the sidewalls of the gate trenches 37. The p$^{++}$-type contact regions 36 are disposed further from the gate trenches 37 than are the n$^+$-type source regions 35.

The n$^+$-type source regions 35 and the p$^{++}$-type contact regions 36 extend in a linear shape in the first direction X and have substantially the same length as that of the contact holes 40a in the longitudinal direction. Substantially the same length means the same length within a range that includes an allowable error due to process variation. Longitudinal ends of the p$^{++}$-type contact regions 36 in the longitudinal direction (the first direction X) are connected to the p$^{++}$-type contact extension portion (fourth semiconductor region) 36a. The p$^{++}$-type contact regions 36 may be omitted. In this instance, instead of the p$^{++}$-type contact regions 36, the p-type base region 34 reaches and is exposed at the first surface portion 10a of the front surface of the semiconductor substrate 10.

The n$^-$-type drift region 32 is provided between the p-type base region 34 and the n$^+$-type drain region 31, and is in contact with the n$^+$-type drain region 31. The n$^-$-type drift region 32 extends from the active region 1 to the chip end. N-type current spreading regions 33, and first and second p$^+$-type regions (first and second high-concentration regions) 51, 52 may be selectively provided between the p-type base region 34 and the n$^-$-type drift region 32, at positions closer to the n$^+$-type drain region 31 than are bottoms of the gate trenches 37. The n-type current spreading regions 33 and the first and the second p$^+$-type regions 51, 52 extend in linear shapes in the first direction X and have substantially the same length as that of the gate trenches 37 in the longitudinal direction thereof.

The n-type current spreading regions 33 constitute a so-called current spreading layer (CSL) that reduces carrier spreading resistance. The n-type current spreading regions 33 are in contact with the first and the second p$^+$-type regions 51, 52, and the gate insulating film 38 in the second direction Y. The n-type current spreading regions 33 each has an upper surface (end facing the n$^+$-type source regions 35) that is in contact with the p-type base region 34. The n-type current spreading regions 33 may be omitted. In this instance, instead of the n-type current spreading regions 33, the n$^-$-type drift region 32 reaches the p-type base region 34 and is in contact with the first and the second p$^+$-type regions 51, 52, and the gate insulating film 38 in the second direction Y.

The first and the second p$^+$-type regions 51, 52 have a function of mitigating electric field applied to the gate insulating film 38 at the bottoms of the gate trenches 37. Depth positions of the first and the second p$^+$-type regions 51, 52 may be suitably set. For example, the first and the second p$^+$-type regions 51, 52 may terminate at shallow depth positions that are further from the n$^+$-type drain region 31 than are the n-type current spreading regions 33 and may be entirely surrounded by the n-type current spreading regions 33. Alternatively, the first and the second p$^+$-type regions 51, 52 may reach, in the depth direction Z, positions of substantially the same depth as that of the n-type current spreading regions 33, or may reach deep positions closer to the n$^+$-type drain region 31 than are the n-type current spreading regions 33 and be in contact with the n$^-$-type drift region 32.

Longitudinal ends of the first and the second p$^+$-type regions 51, 52 in the longitudinal direction (the first direction X) are connected to the later-described p$^+$-type extension portion 52a. The first p$^+$-type regions 51 are provided apart from the p-type base region 34 and face the bottoms of the gate trenches 37 in the depth direction Z, respectively. The first p$^+$-type regions 51 may be in contact with the bottoms of the gate trenches 37. The first p$^+$-type regions 51 may be electrically connected to the second p$^+$-type regions 52 at predetermined locations by disposing other p$^+$-type regions (not depicted) at the predetermined regions between the first and the second p$^+$-type regions 51, 52 or by extending portions of the first p$^+$-type regions 51 to the second p$^+$-type regions 52.

Between the gate trenches 37 that are adjacent to one another, the second p$^+$-type regions 52 are provided separate from the first p$^+$-type regions 51 and the gate trenches 37. Upper surfaces of the second p$^+$-type regions 52 are in contact with the p-type base region 34. A portion of the n$^-$-type epitaxial layer 12 excluding the n-type current spreading regions 33, the first and the second p$^+$-type regions 51, 52, the p$^+$-type extension portion 52a, later-described p$^-$-type regions 21, and the later-described n$^+$-type channel stopper region 22 constitutes the n$^-$-type drift region 32. The n$^-$-type drift region 32 is provided between and in contact with these regions and the n$^+$-type drain region 31.

The interlayer insulating film 40 is provided on the gate insulating film 38 of the front surface of the semiconductor substrate 10 and spans an entire area of the front surface of the semiconductor substrate 10; the interlayer insulating film 40 covers the gate electrodes 39, the field oxide film 61, and the gate polysilicon wiring layer 62. The contact holes 40a, 40b of the active region 1 penetrate through the interlayer insulating film 40 and the gate insulating film 38 in the depth direction Z and reach the front surface of the semiconductor substrate 10. The contact holes 40a, 40b of the active region 1 extend in a striped pattern in the first direction X and span an entire area of the active region 1. A contact hole 40c of the intermediate region 3 penetrates through the interlayer insulating film 40 in the depth direction Z and reaches the gate metal wiring layer 63.

The contact holes 40b that are outermost (closest to chip end) in the active region 1 are provided closer to the chip end in the second direction Y than are the gate trenches 37 that are outermost (closest to chip end) and in an entire area thereof, expose the later-described p$^{++}$-type contact extension portion 36a. Closer to the chip end in the second direction Y than are the gate trenches 37 that are outermost is free of the n$^+$-type source regions 35. The contact holes 40a of the active region 1 are provided between the gate trenches 37 that are adjacent to one another; the contact holes 40a expose the n$^+$-type source regions 35 and the p$^{++}$-type contact regions 36. Longitudinal ends of the contact holes 40a of the active region 1 in the longitudinal direction (the first direction X) may expose the p$^{++}$-type contact extension portion 36a.

In the intermediate region 3, the p$^{++}$-type contact extension portion 36a is provided in a surface region at the first surface portion 10a of the front surface of the semiconductor substrate 10, at a position facing the gate polysilicon wiring layer 62 in the depth direction Z. The p$^{++}$-type contact extension portion 36a is one of the p$^{++}$-type contact regions 36 extending in the intermediate region 3 and is provided in an entire area between the first surface portion 10a of the front surface of the semiconductor substrate 10 and a p-type extension portion 34a. The p$^{++}$-type contact extension portion 36a is exposed at the first and the third surface portions 10a, 10c of the front surface of the semiconductor substrate 10 and is exposed in an entire area of the contact holes 40b that are outermost in the active region 1.

The p-type extension portion 34a is a portion of the p-type base region 34 extending in the intermediate region 3, is provided in an entire area of the intermediate region 3, and is exposed at the third surface portion 10c of the front surface of the semiconductor substrate 10. In the intermediate region 3 and the edge termination region 2, being exposed at the first to the third surface portions 10a to 10c of the front surface of the semiconductor substrate 1 means being in contact with the gate insulating film 38 on the first to the third surface portions 10a to 10c. The $p^{++}$-type contact extension portion 36a may be omitted. In this instance, instead of the $p^{++}$-type contact extension portion 36a, the p-type extension portion 34a reaches and is exposed at the first surface portion 10a of the front surface of the semiconductor substrate 10. A $p^+$-type extension portion (third high-concentration region) 52a may be provided between the p-type extension portion 34a and the $n^-$-type drift region 32. The $p^+$-type extension portion 52a is a portion of one of the second $p^+$-type regions 52 extending in the intermediate region 3.

Further, the $p^+$-type extension portion 52a extends outward (toward the chip end) from the drop 14 to a position exposing the $p^+$-type extension portion 52a at the second surface portion 10b of the front surface of the semiconductor substrate 10. The $p^+$-type extension portion 52a may be exposed at the third surface portion 10c of the front surface of the semiconductor substrate 10. The p-type extension portion 34a, the $p^{++}$-type contact extension portion 36a, and the $p^+$-type extension portion 52a surround the periphery of the active region 1 and extend inward (toward the chip center) from the intermediate region 3 to the gate trenches 37. The $p^{++}$-type contact extension portion 36a, the p-type extension portion 34a, and the $p^+$-type extension portion 52a form a path of holes when the holes generated in the intermediate region 3 and the edge termination region 2 are pulled out to the source electrode 41. Of the $p^{++}$-type contact extension portion 36a, the p-type extension portion 34a, and the $p^+$-type extension portion 52a that form the path of the holes, hole current density is greatest in the $p^{++}$-type contact extension portion 36a, which has the lowest resistance.

Further, in the intermediate region 3, the low carrier lifetime region 71 is provided in a surface region at the first surface portion 10a of the front surface of the semiconductor substrate 10, at least at a position facing the gate polysilicon wiring layer 62 in the depth direction Z; the low carrier lifetime region 71 overlaps the $p^{++}$-type contact extension portion 36a. The low carrier lifetime region 71 is provided separate from the gate trenches 37 and the $n^+$-type source regions 35. The low carrier lifetime region 71 is positioned closer to the chip end than are the contact holes 40a, 40b of the active region 1 and is separate from the source electrode 41. A reason for this is that when the low carrier lifetime region 71 is in contact with the source electrode 41, the $n^+$-type source regions 35, and the gate insulating film 38 at the inner walls of the gate trenches 37, electrical characteristics of the active region 1 are adversely affected.

The low carrier lifetime region 71 may reach a deep position in a direction toward the $n^+$-type drain region 31 so as to overlap the p-type extension portion 34a or further overlap the $p^+$-type extension portion 52a. Preferably, the low carrier lifetime region 71 may be apart from the gate trenches 37, the $n^+$-type source regions 35, and the source electrode 41, and may overlap substantially an entire area of the $p^{++}$-type contact extension portion 36a, the p-type extension portion 34a, and the $p^+$-type extension portion 52a. The low carrier lifetime region 71 may be in contact with the $n^-$-type drift region 32. The low carrier lifetime region 71 may face the source electrode 41 in the depth direction Z with the interlayer insulating film 40 intervening therebetween. The low carrier lifetime region 71 may be exposed at the first and the third surface portions 10a, 10c of the front surface of the semiconductor substrate 10.

In the intermediate region 3 and the edge termination region 2, an entire area of the front surface of the semiconductor substrate 10 is covered by the insulating layer in which the gate insulating film 38, the field oxide film 61, and the interlayer insulating film 40 are sequentially stacked in the order stated. In the intermediate region 3 and the edge termination region 2, the entire area of the front surface of the semiconductor substrate 10 is in contact with the gate insulating film 38. In the intermediate region 3, the gate polysilicon wiring layer 62 and the gate metal wiring layer 63 that constitute the gate runner are sequentially stacked in the order stated on the gate insulating film 38 at the front surface of the semiconductor substrate 10, via the field oxide film 61. The gate polysilicon wiring layer 62 and the gate metal wiring layer 63 surround the periphery of the active region 1.

The field oxide film 61 and the gate polysilicon wiring layer 62 are provided between the gate insulating film 38 and the interlayer insulating film 40. The chip-center end 61a of the field oxide film 61 is apart from sidewalls of the contact holes 40a, 40b of the active region 1 (i.e., the border between the active region 1 and the intermediate region 3) and is positioned closer to the chip end than are the sidewalls of the contact holes 40a, 40b of the active region 1 (i.e., the border between the active region 1 and the intermediate region 3). Further, the chip-center end 61a of the field oxide film 61 is positioned closer to the chip end than is the chip-center end 62a of the gate polysilicon wiring layer 62. The chip-center end 61a of the field oxide film 61 may form an obtuse angle with (have a sloped plane relative to) or form a substantially right angle with (have an orthogonal plane relative to) the first surface portion 10a of the front surface of the semiconductor substrate 10.

The chip-center end 61a of the field oxide film 61, along an entire outer periphery of the active region 1, is positioned closer to the chip end than is the border between the active region 1 and the intermediate region 3 (the longitudinal ends of the contact holes 40a, 40b in the longitudinal direction and the chip-end sidewalls of the contact holes 40b). The field oxide film 61 extends from the intermediate region 3 to the chip end. The gate polysilicon wiring layer 62 is provided on the field oxide film 61 and surrounds the periphery of the active region 1. The gate polysilicon wiring layer 62 extends closer to the chip center than does the chip-center end 61a of the field oxide film 61 and terminates on the gate insulating film 38 on the front surface of the semiconductor substrate 10, in the intermediate region 3.

A chip-center portion 62b of the gate polysilicon wiring layer 62 is positioned closer to the chip center than is the chip-center end 61a of the field oxide film 61 and faces the semiconductor substrate 10 in the depth direction Z with the gate insulating film 38 intervening therebetween. The field oxide film 61 and the gate polysilicon wiring layer 62 are covered by the interlayer insulating film 40. Therefore, the insulating layer with a relative thick thickness and in which the gate insulating film 38 and the field oxide film 61 are sequentially stacked in the order stated and an insulating layer with a relatively thin thickness and formed only by the gate insulating film 38 relatively closer to the chip center are present between the first surface portion 10a of the front surface of the semiconductor substrate 10 and the gate polysilicon wiring layer 62.

The gate polysilicon wiring layer 62 faces the longitudinal ends of the gate trenches 37 in the depth direction Z and at the longitudinal ends of the gate trenches 37, is connected to the gate electrodes 39. The gate metal wiring layer 63 is in contact with the gate polysilicon wiring layer 62 via the contact hole 40c of the interlayer insulating film 40. The gate electrodes 39 and the gate pad 64 are electrically connected via the gate runner that is configured by the gate polysilicon wiring layer 62 and the gate metal wiring layer 63. The gate pad 64 has the same layered structure as that of the gate runner and is provided on the field oxide film 61.

In surface regions of the n$^-$-type epitaxial layer 12 that forms the second surface portion 10b of the front surface of the semiconductor substrate 10 in the edge termination region 2, the p$^-$-type regions 21 that configure the FLR structure 20 are selectively provided apart from one another. An entire area of the second surface portion 10b of the front surface of the semiconductor substrate 10 is covered by the insulating layer in which the gate insulating film 38, the field oxide film 61 and the interlayer insulating film 40 are sequentially stacked in the order stated. On the p$^-$-type regions 21, a field plate (FP) that is a floating-potential metal electrode may be provided in contact with each of the p$^-$-type regions 21.

In a surface region of the n$^-$-type epitaxial layer 12 that forms the second surface portion 10b of the front surface of the semiconductor substrate 10 in the edge termination region 2, the n$^+$-type channel stopper region 22 may be provided closer to the chip end than is the FLR structure 20 and apart from the FLR structure 20. The n$^+$-type channel stopper region 22 is exposed at the ends of the semiconductor substrate 10. The n$^+$-type channel stopper region 22 has a function of suppressing the spreading of a depletion layer in the n$^-$-type drift region 32, from the active region 1 to the chip end, when the SiC-MOSFET is off. On the n$^+$-type channel stopper region 22, a channel stopper electrode (not depicted) may be provided in contact with the n$^+$-type channel stopper region 22.

The source electrode 41, in the contact holes 40a, 40b, is in ohmic contact with the front surface of the semiconductor substrate 10 and is electrically connected to the p-type base region 34, the n$^+$-type source regions 35, the p$^{++}$-type contact regions 36, the p-type extension portion 34a, and the p$^{++}$-type contact extension portion 36a. The source electrode 41 may extend on the interlayer insulating film 40 in a direction toward the chip end to an extent so as to not face the gate polysilicon wiring layer 62 in the depth direction Z. In the active region 1, a barrier metal (not depicted) that prevents interaction between the source electrode 41 and a layer therebelow and interaction between the interlayer insulating film 40 and a layer therebelow may be provided between the source electrode 41 and the interlayer insulating film 40.

The passivation film 42 covers an entire area of the front surface of the semiconductor substrate 10. In different openings of the passivation film 42, the source electrode 41 and the gate pad 64 are exposed, respectively. The passivation film 42, for example, is a polyimide film. In the edge termination region 2, the n$^-$-type epitaxial layer may be exposed at the front surface of the semiconductor substrate 10 or the front surface of the semiconductor substrate 10 may be continuously flat from the active region 1 to the chip end, free of the drop 14. A drain electrode (second electrode) 43 is in ohmic contact with an entire area of the back surface (back surface of the n$^+$-type starting substrate 11) of the semiconductor substrate 10.

Operation of the silicon carbide semiconductor device 30 (SiC-MOSFET) according to the first embodiment is described. When voltage (forward voltage) that is positive with respect to the source electrode 41 is applied to the drain electrode 43 and voltage that is at least equal to a gate threshold voltage is applied to the gate electrodes 39, holes accumulate in the p-type base region 34 and a channel (n-type inversion layer) is formed along parasitic capacitance due to the electrostatic capacitance of the gate insulating film 38 at the sidewalls of the gate trenches 37. As a result, the main current (drift current) flows from the n$^+$-type drain region 31, through the channels and to the n$^+$-type source regions 35, whereby the SiC-MOSFET turns on.

On the other hand, when forward voltage is applied between the source and drain and voltage less than the gate threshold voltage is applied to the gate electrodes 39, the pn junctions (the main junctions) between the first and the second p$^+$-type regions 51, 52, the p-type base region 34, the n-type current spreading regions 33, and the n$^-$-type drift region 32 are reversed biased, whereby electrons are discharged from portions of the p-type base region 34 along the gate trenches 37 and are depleted, whereby the main current stops flowing and thus, the SiC-MOSFET maintains an off state. At this time, the main junctions (the pn junctions) of the active region 1 are reverse biased, whereby a depletion layer spreads from the pn junctions and a predetermined breakdown voltage of the active region 1 is sustained.

Further, when the SiC-MOSFET is off, the depletion layer that spread from the main junctions of the active region 1 spreads in the edge termination region 2 in the direction of the normal, to the chip end by the pn junctions between the p$^-$-type regions 21 and the n$^-$-type drift region 32 of the edge termination region 2. To an extent that the depletion layer spreads in the edge termination region 2 in a direction toward the chip end, a predetermined breakdown voltage of the edge termination region 2 may be ensured based on the breakdown field strength of SiC and depletion layer width. Further, electric field of the edge termination region 2 is dispersed by the FLR structure 20, whereby the breakdown voltage of the edge termination region 2 may be enhanced.

Electrons and holes accumulated in the semiconductor substrate 10, along the parasitic capacitance when the SiC-MOSFET turns on or off, are discharged to an external destination through the drain electrode 43 and the source electrode 41, respectively, during the switching transition period for the SiC-MOSFET to switch from on to off or from off to on, or during reverse recovery of the parasitic diode formed by the main junctions of the SiC-MOSFET, etc. Further, due to steep dV/dt (variation of drain-source voltage per unit time) occurring during the switching transition period from on to off of the SiC-MOSFET, displacement current (hole current) is generated in the n$^-$-type drift region 32 in the edge termination region 2 and flows to the active region 1.

Holes generated in the intermediate region 3 and the edge termination region 2 pass through the p$^+$-type extension portion 52a, the p-type extension portion 34a, and the p$^{++}$-type contact extension portion 36a and are pulled out to the source electrode 41 from the contact holes 40a, 40b of the active region 1. At this time, holes are trapped and eliminated by the carrier lifetime killers in the low carrier lifetime region 71, promoting recombination of electrons and holes at the corner portions of the intermediate region 3. Therefore, hole density of the corner portions of the intermediate region 3 in which paths of the holes are narrower than the paths of the holes in the linear portions of the intermediate region 3 may be reduced to about the same as the hole density of the linear portions of the intermediate region 3.

As a result, hole current concentration at the corners 1a of the active region 1 may be suppressed, whereby increases in the potential of the p-type regions (the $p^{++}$-type contact extension portion 36a, the p-type extension portion 34a, and the $p^+$-type extension portion 52a) constituting the paths of the holes at the corner portions of the intermediate region 3 may be suppressed. Thus, at the corner portions of the intermediate region 3, dielectric breakdown of a portion (the insulating layer directly beneath the chip-center portion 62b of the gate polysilicon wiring layer 62 and in which only the gate insulating film 38 is disposed and where the thickness is relatively thin) of the insulating layer that is between the front surface of the semiconductor substrate 10 and the gate polysilicon wiring layer 62 may be prevented.

Next, a method of manufacturing the silicon carbide semiconductor device 30 according to the first embodiment is described. First, the $n^+$-type starting substrate (starting wafer) 11 containing silicon carbide is prepared. Next, the $n^-$-type epitaxial layer 12 constituting the $n^-$-type drift region 32 is epitaxially grown on the front surface of the $n^+$-type starting substrate 11. Next, the first $p^+$-type regions 51 and lower portions (portions facing the $n^+$-type drain region 31) of the second $p^+$-type regions 52 are selectively formed in surface regions of the $n^-$-type epitaxial layer 12 in the active region 1, by photolithography and ion implantation of a p-type impurity.

At this time, a lower portion of the $p^+$-type extension portion 52 is formed in the intermediate region 3, concurrently with the lower portions of the second $p^+$-type regions 52. Further, lower portions of the n-type current spreading regions 33 are formed in surface regions of the $n^-$-type epitaxial layer 12 in the active region 1, by photolithography and ion implantation of an n-type impurity. In the active region 1 and the intermediate region 3, a portion of the $n^-$-type epitaxial layer 12 closer to the $n^+$-type starting substrate 11 than are the first and the second $p^+$-type regions 51, 52, the $p^+$-type extension portion 52a, and the n-type current spreading regions 33 and having the impurity concentration as is, free of ion implantation constitutes the $n^-$-type drift region 32.

Next, the $n^-$-type epitaxial layer 12 is further increased in thickness to a predetermined thickness by epitaxial growth. Next, in the portion epitaxially grown to increase the thickness of the $n^-$-type epitaxial layer 12, upper portions (portions facing the $n^+$-type source regions 35) of the second $p^+$-type regions 52 are selectively formed, by photolithography and ion implantation of a p-type impurity, so as to be adjacent to the lower portions of the second $p^+$-type regions 52 in the depth direction Z. Further, in the portion epitaxially grown to increase the thickness of the $n^-$-type epitaxial layer 12, upper portions of the n-type current spreading regions 33 are formed, by photolithography and ion implantation of an n-type impurity, so as to be in contact with the lower portions of the n-type current spreading regions 33 in the depth direction Z.

At this time, an upper portion of the $p^+$-type extension portion 52a is formed concurrently with the upper portions of the second $p^+$-type regions 52 so as to be in contact with the lower portion of the $p^+$-type extension portion 52a in the depth direction Z. In the $n^-$-type epitaxial layer 12, the upper portions and the lower portions respectively adjacent thereto in the depth direction Z are connected, thereby forming the second $p^+$-type regions 52, the n-type current spreading regions 33, and the $p^+$-type extension portion 52a. The sequence of ion implantations performed in the portion first epitaxially grown of the $n^-$-type epitaxial layer 12 may be interchanged. The sequence of ion implantations in the portion that increases the thickness of the $n^-$-type epitaxial layer 12 may be interchanged.

Next, on the $n^-$-type epitaxial layer 12, the p-type epitaxial layer 13 is epitaxially grown. By the processes up to here, the semiconductor substrate (semiconductor wafer) 10 in which the epitaxial layers 12, 13 are sequentially stacked on the $n^+$-type starting substrate 11 is completed. Next, a portion of the p-type epitaxial layer 13 in the edge termination region 2 is removed by etching, whereby at the front surface of the semiconductor substrate 10, the drop 14 is formed such that a portion (the second surface portion 10b) in the edge termination region 2 is lower than a portion (the first surface portion 10a) of the active region 1 and the intermediate region 3. The $n^-$-type epitaxial layer 12 is exposed at the newly formed second surface portion 10b of the front surface of the semiconductor substrate 10.

The third surface portion 10c that connects the first surface portion 10a and the second surface portion 10b of the front surface of the semiconductor substrate 10, for example, may form an obtuse angle with (have a sloped plane relative to) the first and the second surface portions 10a, 10b, or form a substantially right angle therewith. The side surface of the p-type epitaxial layer 13 is exposed at the third surface portion 10c of the front surface of the semiconductor substrate 10. By the etching that removes portion of the p-type epitaxial layer 13 in the edge termination region 2 and exposes the $n^-$-type epitaxial layer 12 at the newly formed second surface portion 10b of the front surface of the semiconductor substrate 10, a surface region of the $n^-$-type epitaxial layer 12 may be slightly removed with the p-type epitaxial layer 13.

Next, by repeatedly performing photolithography and ion implantation under predetermined conditions, the $n^+$-type source regions 35 and the $p^{++}$-type contact regions 36 are selectively formed in surface regions of the p-type epitaxial layer 13. At this time, the $p^{++}$-type contact extension portion 36a is formed concurrently with the $p^{++}$-type contact regions 36. Portions of the p-type epitaxial layer 13 closer to the $n^+$-type starting substrate 11 than are the $n^+$-type source regions 35, the $p^{++}$-type contact regions 36, and the $p^{++}$-type contact extension portion 36a and having the impurity concentration as is, free of ion implantation constitutes the p-type base region 34 and the p-type extension portion 34a.

Further, by repeatedly performing photolithography and ion implantation under predetermined conditions, in the edge termination region 2, the $p^-$-type regions 21 configuring the FLR structure 20 and the $n^+$-type channel stopper region 22 are selectively provided in surface regions of the $n^-$-type epitaxial layer 12 exposed at the second surface portion 10b of the front surface of the semiconductor substrate 10. In the edge termination region 2, a portion of the $n^-$-type epitaxial layer 12 closer to the $n^+$-type starting substrate 11 than are the $p^-$-type regions 21 and the $n^+$-type channel stopper region 22 and having the impurity concentration as is, free of ion implantation constitutes the $n^-$-type drift region 32.

In the ion implantation of an n-type impurity (donor) described above, for example, phosphorus (P) or nitrogen (N), arsenic (As), etc. may be used as a dopant. In the ion implantation of a p-type impurity (acceptor) described above, for example, aluminum, etc. may be used as a dopant. Next, a heat treatment (activation annealing) for activating the impurities ion-implanted in the semiconductor substrate 10 (the epitaxial layers 12, 13) is performed. The activation annealing may be performed one time, collectively after all the ion implantations described above are performed, or the activation annealing may be performed each time ion implantation is performed.

Next, by photolithography and ion implantation or irradiation, an impurity constituting the carrier lifetime killer is introduced only in the corner portions of the intermediate region 3, thereby forming in the corner portions of the intermediate region 3, the low carrier lifetime region 71 in surface regions at the front surface of the semiconductor substrate 10. The low carrier lifetime region 71 may be formed at any timing after deposition of the p-type epitaxial layer 13 but before the formation of the later-described gate trenches 37. A portion of the low carrier lifetime region 71 overlapping the $p^+$-type extension portion 52$a$ may be formed in the $n^-$-type epitaxial layer 12 before the deposition of the p-type epitaxial layer 13.

Next, the gate trenches 37 that penetrate through the $n^+$-type source regions 35 and the p-type base region 34 from the front surface of the semiconductor substrate 10 and terminate in the n-type current spreading regions 33 so as to face the first $p^+$-type regions 51 in the depth direction Z, respectively, are formed by photolithography and etching. The gate trenches 37 are formed in a striped pattern extending in the first direction X. The longitudinal ends of the gate trenches 37 terminate in the intermediate region 3. Next, the gate insulating film 38 is formed along an entire area of the front surface of the semiconductor substrate 10 and the inner walls (sidewalls and bottoms) of the gate trenches 37.

Next, the field oxide film 61 is deposited on the gate insulating film 38 at the front surface of the semiconductor substrate 10. Next, by photolithography and, for example, wet etching, a portion of the field oxide film 61 in the active region 1 is removed, leaving the field oxide film 61 only in the intermediate region 3 and the edge termination region 2. Further, the position of the chip-center end 61$a$ of the field oxide film 61 is set so that at least a portion of each of the ends of the gate trenches 37 is not covered by the field oxide film 61. Next, a polysilicon layer is deposited on an entire area of the front surface of the semiconductor substrate 10 so as to be embedded in the gate trenches 37.

Next, the polysilicon layer is selectively removed by photolithography and etching, leaving portions of the polysilicon layer constituting the gate electrodes 39 in the gate trenches 37; and leaving a portion constituting the gate polysilicon wiring layer 62 and a portion constituting the gate polysilicon wiring layer configuring the gate pad 64, at an upper most level of the front surface of the semiconductor substrate 10. At this time, the polysilicon layer is left so as to connect the gate polysilicon wiring layer 62 and the gate electrodes 39 and cover the longitudinal ends of the gate trenches 37.

Next, the interlayer insulating film 40 that covers the portions of the gate polysilicon wiring layer configuring the gate electrodes 39, the gate polysilicon wiring layer 62, and the gate pad 64 is formed in on an entire area of the front surface of the semiconductor substrate 10. Next, the contact holes 40$a$, 40$b$ that penetrate through the interlayer insulating film 40 and the gate insulating film 38 in the depth direction Z and reach the front surface of the semiconductor substrate 10 are formed in the active region 1 by photolithography and etching. In the contact holes 40$a$, the $n^+$-type source regions 35 and the $p^{++}$-type contact regions 36 are exposed. In the contact holes 40$b$ that are outermost, the $p^{++}$-type contact extension portion 36$a$ is exposed.

Further, the contact hole 40$c$ that penetrates through the interlayer insulating film 40 in the depth direction Z and reaches the gate polysilicon wiring layer 62, and a contact hole (not depicted) that reaches the gate polysilicon wiring layer configuring the gate pad 64 are formed in the intermediate region 3 by photolithography and etching. Next, the interlayer insulating film 40 is planarized (reflow) by a heat treatment. Next, a metal layer is formed on an entire area of the front surface of the semiconductor substrate 10 so as to be embedded in the contact holes. Next, the metal layer is patterned and portions thereof constituting the source electrode 41, the gate metal wiring layer 63, and the gate metal wiring layer configuring the gate pad 64 are each left.

The source electrode 41 is in ohmic contact with the front surface of the semiconductor substrate 10 in the contact holes 40$a$, 40$b$. The source electrode 41 is disposed apart from the gate metal wiring layer configuring the gate pad 64 and the gate metal wiring layer 63. The gate metal wiring layer 63 is in contact with the gate polysilicon wiring layer 62 in the contact hole 40$c$. In a non-depicted contact hole, the gate metal wiring layer that configures the gate pad 64 is in contact with the gate polysilicon wiring layer that configures the gate pad 64. The gate metal wiring layer 63 and the gate metal wiring layer configuring the gate pad 64 are connected to each other.

Further, the drain electrode 43 is formed on the back surface of the semiconductor substrate 10. Next, the passivation film 42 is formed on an entire area of the front surface of the semiconductor substrate 10; the passivation film 42 covers the source electrode 41 and, the gate metal wiring layer 63 and the gate pad 64 configuring the gate metal wiring layer. Next, the passivation film 42 is selectively removed, thereby forming different openings in which the source electrode 41 (the source pad) and the gate pad 64 are exposed, respectively. Thereafter, the semiconductor substrate 10 (semiconductor wafer) is diced (cut) into individual chips, whereby the MOSFET (the silicon carbide semiconductor device 30) in depicted in FIGS. 1 to 6 is completed.

As described above, according to the first embodiment, in the corner portions of the intermediate region that is between the active region and the edge termination region, the low carrier lifetime region is provided facing the gate polysilicon wiring layer in the depth direction so as to overlap the p-type regions in surface regions at the front surface of the semiconductor substrate. The linear portions of the intermediate region are free of low carrier lifetime region. As a result, the average time until the holes that are generated in the intermediate region and the edge termination region and pass through the p-type regions (the $p^+$-type extension portion, the p-type extension portion, and the $p^{++}$-type contact extension portion) of the intermediate region, and flow in a direction to the active region disappear may be shortened in the corner portions of the intermediate region compared to that in the linear portions of the intermediate region.

The low carrier lifetime region is provided in the corner portions of the intermediate region, whereby the hole density of the corner portions of the intermediate region where the hole paths are narrower than those in the linear portions of the intermediate region may be set to be reduced to about the same hole density as that of the linear portions of the intermediate region, whereby hole current concentration at the corners of the active region may be suppressed. As a result, at the corner portions of the intermediate region, increases in the potential of the p-type regions constituting the hole paths in the intermediate region may be suppressed. Thus, between the front surface of the semiconductor substrate and the gate polysilicon wiring layer, the portion (the gate insulating film) of the insulating layer having a relatively thinner thickness may be prevented from dielectrically breaking down in the corner portions of the intermediate region.

For example, when the gate resistance Rg is adjusted to be increased similarly to the conventional techniques, not only does the hole current amount of the path of the holes that pass through the SiC portion directly beneath the gate runner in the intermediate region decrease but the hole current amount of the path of the holes that pass through portions along the trench gates in the active region and are discharged by the source electrode also decreases. Therefore, switching characteristics of the SiC-MOSFET degrade (switching speed decreases, switching loss increases). In particular, conventionally, the gate resistance Rg has been adjusted so that the switching transition period for the SiC-MOSFET to switch from on to off or from off to on, or the steep dV/dt occurring with reverse recovery of the parasitic diode of the SiC-MOSFET becomes, for example, 20 kV/μsec.

It was confirmed by the inventor that in the conventional structure (refer to FIGS. 11 to 13), when high-speed switching in which the dV/dt exceeds 20 kV/μsec is performed, dielectric breakdown of the gate insulating film occurs at the corners of the active region. Further, it was confirmed by the inventor that in an instance in which internal inductance of a semiconductor package is at least 10 nH, when high-speed switching in which the dV/dt exceeds 20 kV/μsec is performed by the SiC-MOSFET chip (semiconductor chip) mounted in the semiconductor package, voltage waveforms/current waveforms at parts configuring the semiconductor package oscillate, parts of the semiconductor package turn on at unintended timings (erroneously operate), and malfunction of the semiconductor package occurred.

In contrast, according to the first embodiment, the low carrier lifetime region is provided in the corner portions of the intermediate region, whereby the hole density of the hole paths in the corner portions of the intermediate region may be reduced. Therefore, to reduce the hole density of the hole path, increasing the gate resistance Rg is unnecessary and degradation of switching characteristics may be suppressed. Further, dV/dt capability of the corners of the active region where hole current tends to concentrate may be enhanced. Further, increasing the chip size and reducing forward loss are unnecessary and cost increases may be suppressed. Therefore, a SiC-MOSFET that has high dielectric breakdown capability, favorable switching characteristics, and that suppresses cost increases may be provided.

A structure of a silicon carbide semiconductor device according to a second embodiment is described. FIGS. 7, 8, 9, and 10 are cross-sectional views of the structure of the silicon carbide semiconductor device according to the second embodiment. A silicon carbide semiconductor device 70 according to the second embodiment has a layout when the silicon carbide semiconductor device 70 is viewed from the front side of the semiconductor substrate 10 (refer to FIGS. 1 and 2) and a configuration of the low carrier lifetime region (hereinafter, first low carrier lifetime region) 71 that are similar to those of the first embodiment. FIGS. 7, 8, 9, and 10 are cross-sectional views of the structure along cutting line A-A', cutting line B-B', cutting line C-C', and cutting line D-D' in FIG. 2, respectively.

The silicon carbide semiconductor device 70 according to the second embodiment differs from the silicon carbide semiconductor device 30 according to the first embodiment (refer to FIGS. 3 to 6) in that a second low carrier lifetime region 72 (hatched portion) is further provided. The second low carrier lifetime region 72 has a function of suppressing degradation of a parasitic diode formed by the main junctions (pn junctions between the first and the second $p^+$-type regions 51, 52, the p-type base region 34, the n-type current spreading regions 33, and the $n^-$-type drift region 32) of the silicon carbide semiconductor device 70 (SiC-MOSFET).

The second low carrier lifetime region 72 is provided between and in contact with the $n^-$-type drift region 32 and all the first and the second $p^+$-type regions 51, 52 of the active region 1. The second low carrier lifetime region 72 is not provided between the $n^-$-type drift region 32 and junction FET (JFET) regions respectively between the first and the second $p^+$-type regions 51, 52 that are adjacent to one another. The second low carrier lifetime region 72 is provided between and in contact with the $n^-$-type drift region 32 and the $p^+$-type extension portion 52a of the intermediate region 3.

In other words, the second low carrier lifetime region 72 is provided so as to face the JFET regions in the depth direction Z and be in contact with an entire area of surfaces of the pn junctions between the first and the second $p^+$-type regions 51, 52, the $p^+$-type extension portion 52a, and the $n^-$-type drift region 32. In an instance in which the first low carrier lifetime region 71 is provided at a depth reaching the $n^-$-type drift region 32 on the $n^+$-type drain region 31 side, the second low carrier lifetime region 72 is in contact with the first low carrier lifetime region 71 in the depth direction.

The second low carrier lifetime region 72 is a region in which an impurity constituting a carrier lifetime killer is introduced. The carrier lifetime killer introduced to form the second low carrier lifetime region 72 may be the impurity used as the carrier lifetime killer in the IGBT, the diode, etc. and is, for example, helium, protons, or vanadium, etc. The carrier lifetime killer introduced in the first and the second low carrier lifetime regions 71, 72 may be of the same ion species.

In the second low carrier lifetime region 72, the carrier lifetime killer is introduced at a lower dose amount than is the dose amount of the carrier lifetime killer introduced in the first low carrier lifetime region 71. For example, the dose amount of the second low carrier lifetime region 72 is a dose that is about 5% to 50% of that of the first low carrier lifetime region 71. A width of the second low carrier lifetime region 72, for example, may be substantially the same width as that of the first and the second $p^+$-type regions 51, 52, and the $p^+$-type extension portion 52a adjacent thereto in the depth direction Z. The same width means widths are the same within a range that includes an allowed error due to process variation.

A method of manufacturing the silicon carbide semiconductor device 70 according to the second embodiment may be implemented by adding a formation process of the second low carrier lifetime region 72 to the method of manufacturing the silicon carbide semiconductor device 30 according to the first embodiment. The formation of the second low carrier lifetime region 72 may be performed continuous with the formation of the first low carrier lifetime region 71 either before or thereafter, or may be performed at a different timing from the formation of the first low carrier lifetime region 71. Further, the first and the second low carrier lifetime regions 71, 72 may be formed under the same ion implantation conditions (irradiation conditions).

In an instance of the same ion implantation conditions (irradiation conditions), dose amounts of the carrier lifetime killer introduced in the first and the second low carrier lifetime regions 71, 72, respectively, suffice to be adjusted by, for example, the number of ion implantations (irradiations) being greater for forming the first low carrier lifetime region 71 than for forming the second low carrier lifetime region 72, or by formation regions of the second low carrier lifetime region 72 being covered by a mask so that the ion implantation (irradiation) amount in the second low carrier lifetime region 72 is less than during the formation of the first low carrier lifetime region 71, etc.

As described above, according to the second embodiment, effects similar to those of the first embodiment may be obtained. Further, according to the second embodiment, during operation of the parasitic diode formed by the main junctions of the SiC-MOSFET, holes are trapped by the carrier lifetime killer in the second low carrier lifetime region and disappear, whereby recombination of electrons and holes in the n$^-$-type drift region progresses. As a result, the amount of forward current of the parasitic diode of the SiC-MOSFET decreases and expansion of stacking faults in the epitaxial layers is suppressed, whereby a SiC-MOSFET having minimal variation of characteristics over time and high reliability may be provided.

In the foregoing, the present invention is not limited to the embodiments described above and modification within a range not departing from the spirit of the invention are possible. For example, a current sensing portion may be disposed on a single semiconductor substrate together with the SiC-MOSFET that constitutes a main semiconductor element device. The current sensing portion is a SiC-MOSFET having the same structure as that of the main semiconductor device element; the current sensing portion is connected in parallel with the main semiconductor device element and has a function of detecting over current (OC) flowing in the main semiconductor device element. The current sensing portion, for example, may be disposed in the linear portions of the intermediate region, or a non-operating region, which is a portion of the active region that is not used as the main semiconductor device element. Further, the present invention is further applicable in an instance in which a planar gate structure is used instead of a trench structure. Further, the present invention is similarly implemented when the conductivity types (n-type, p-type) are reversed.

According to the invention described above, for minority carriers that are generated in the intermediate region and the termination region and pass through p-type regions (third high-concentration region, second semiconductor region, and fourth semiconductor region) of the intermediate region while flowing in a direction to the active region, the average time for the minority carriers to disappear may be shortened for portions (corner portions) of the intermediate region adjacent to the corners of the active region corners as compared to that of other portions (linear portions) of the intermediate region. As a result, the hole density of portions (the corner portions of the intermediate region) where the paths of the minority carriers are narrow may be set so as to decrease and be about the same hole density as that of other portions of the intermediate region, and the hole current concentration at the corners of the active region may be suppressed.

As a result, at the corner portions of the intermediate region, increases in the potential of the p-type regions forming the paths of the minority carriers are suppressed, and the portion (the gate insulating film) of the insulating layer having a relatively thin thickness between the semiconductor substrate and the gate polysilicon wiring layer may be prevented from electrically breaking down at the corner portions of the intermediate region. Further, increasing gate resistance is unnecessary to reduce the hole density of the hole paths, and degradation of switching characteristics may be suppressed. Further, the dV/dt capability of the corners of the active region where hole current tends to concentrate may be enhanced. Further, increasing the chip size and reducing forward loss are unnecessary to maintain the total conduction loss.

The silicon carbide semiconductor device according to the present invention achieves an effect in that a semiconductor device with a high dielectric breakdown capability and favorable switching characteristics (high-speed switching, low switching loss) and capable of suppressing increases in cost is provided.

As described above, the silicon carbide semiconductor device according to the present invention is useful for power semiconductor devices that control high voltage and large current.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
    a semiconductor substrate containing silicon carbide, the semiconductor substrate having a first main surface and a second main surface opposite to each other, the semiconductor substrate further having:
        an active region through which a main current flows, the active region being provided in a rectangular shape in a plan view of the silicon carbide semiconductor device,
        a termination region surrounding a periphery of the active region, and
        an intermediate region between the active region and the termination region;
    a first semiconductor region of a first conductivity type, provided in the semiconductor substrate;
    a second semiconductor region of a second conductivity type, provided between the first main surface of the semiconductor substrate and the first semiconductor region, spanning the active region and the intermediate region;
    a plurality of third semiconductor regions of the first conductivity type, selectively provided in the active region, between the first main surface of the semiconductor substrate and the second semiconductor region;
    a gate insulating film provided in contact with a region of the second semiconductor region, between the first semiconductor region and one of the plurality of third semiconductor regions, the gate insulating film covering the first main surface of the semiconductor substrate;
    a gate electrode provided on the gate insulating film;
    a fourth semiconductor region of the second conductivity type, provided in the intermediate region, between the first main surface of the semiconductor substrate and the second semiconductor region, the fourth semiconductor region having an impurity concentration that is higher than that of the second semiconductor region;
    a field oxide film provided in the intermediate region, on the gate insulating film at the first main surface of the semiconductor substrate;
    a gate polysilicon wiring layer surrounding the periphery of the active region and provided on the field oxide film, the gate polysilicon wiring layer having an outer end and an inner end opposite to the outer end and closer than the outer end to a center of the semiconductor substrate in a plan view of the semiconductor device, and being connected to the gate electrode at the inner end, the gate polysilicon wiring layer facing the fourth semiconductor region in a depth direction with the field oxide film and the gate insulating film intervening therebetween, wherein the gate polysilicon wiring layer extends closer to the center of the silicon carbide semiconductor device than does the field oxide film, the gate polysilicon wiring layer having an inner end portion that faces the fourth semiconductor region in the depth direction with the gate insulating film intervening therebetween;

an interlayer insulating film covering the gate electrode and the gate polysilicon wiring layer;

a contact hole penetrating through the interlayer insulating film in the depth direction and exposing the first main surface of the semiconductor substrate;

a first electrode electrically connected to the second semiconductor region, the plurality of third semiconductor regions, and the fourth semiconductor region, via the contact hole;

a second electrode provided on the second main surface of the semiconductor substrate; and a first low carrier lifetime region containing a first carrier lifetime killer provided in a portion of the intermediate region adjacent to one corner of the active region, the first low carrier lifetime region facing the gate polysilicon wiring layer in the depth direction and overlapping the fourth semiconductor region in the plan view.

2. The silicon carbide semiconductor device according to claim 1, wherein
the first low carrier lifetime region is provided apart from the plurality of third semiconductor regions.

3. The silicon carbide semiconductor device according to claim 1, wherein
the fourth semiconductor region has an outer end and an inner end opposite to the outer end and closer than the outer end to the center of the semiconductor device in the plan view, and
the first low carrier lifetime region has an outer end and an inner end opposite to the outer end and closer than the outer end to the center of the semiconductor device, and the outer end of the first low carrier lifetime region extends to reach the outer end of the fourth semiconductor region in the plan view.

4. The silicon carbide semiconductor device according to claim 1, wherein
the first low carrier lifetime region overlaps the fourth semiconductor region and the second semiconductor region in the plan view.

5. The silicon carbide semiconductor device according to claim 1, further comprising
a plurality of trenches, each of the plurality of trenches penetrating through a respective one of the plurality of third semiconductor regions and the second semiconductor region from the first main surface of the semiconductor substrate in the depth direction and reaching the first semiconductor region, each of the plurality of trenches extending linearly in a direction parallel to the first main surface of the semiconductor substrate and reaching the intermediate region from the active region, wherein
the gate electrode is provided in plurality, each of the plurality of gate electrodes being disposed in a respective one of the plurality of trenches via the gate insulating film, each of the plurality of gate electrodes having a longitudinal end in a longitudinal direction in which the plurality of gate electrodes extend and being connected to the gate polysilicon wiring layer at the longitudinal end, and
the first low carrier lifetime region is provided apart from the plurality of trenches.

6. The silicon carbide semiconductor device according to claim 5, further comprising:
a plurality of first high-concentration regions of the second conductivity type, selectively provided at positions deeper than are bottoms of the plurality of trenches in the depth direction from the first main surface of the semiconductor substrate, the plurality of first high-concentration regions being selectively provided apart from the second semiconductor region and in contact with the first semiconductor region, each of the plurality of first high-concentration regions facing a respective one of the bottoms of the plurality of trenches, and having an impurity concentration that is higher than that of the second semiconductor region;
a plurality of second high-concentration regions of the second conductivity type, selectively provided in the active region, between the second semiconductor region and the first semiconductor region, apart from the plurality of first high-concentration regions and the plurality of trenches, and in contact with the second semiconductor region and the first semiconductor region, the plurality of second high-concentration regions reaching positions deeper than the bottoms of the plurality of trenches, in the depth direction from the first main surface of the semiconductor substrate, and having an impurity concentration that is higher than that of the second semiconductor region; and
a third high-concentration region of the second conductivity type, provided in the intermediate region, between the second semiconductor region and the first semiconductor region, the third high-concentration region being in contact with the second semiconductor region and the first semiconductor region and reaching a position deeper than the bottoms of the plurality of trenches in the depth direction from the first main surface of the semiconductor substrate, the third high-concentration region having an impurity concentration that is higher than that of the second semiconductor region, wherein
the first low carrier lifetime region overlaps the fourth semiconductor region, the second semiconductor region, and the third high-concentration region in the plan view.

7. The silicon carbide semiconductor device according to claim 1, wherein
the first carrier lifetime killer is helium, protons, or vanadium.

8. The silicon carbide semiconductor device according to claim 1, wherein
the first low carrier lifetime region contains the carrier lifetime killer at a dosage in a range of $1\times10^{11}/cm^2$ to $1\times10^{12}/cm^2$.

9. The silicon carbide semiconductor device according to claim 6, further comprising
a plurality of second low carrier lifetime regions containing a second carrier lifetime killer, respectively provided between the first semiconductor region and each of the plurality of first high-concentration regions, between the first semiconductor region and each of the plurality of second high-concentration regions, and between the first semiconductor region and the third high-concentration region.

10. The silicon carbide semiconductor device according to claim 9, wherein
the first low carrier lifetime region contains the carrier lifetime killer at a dosage that is higher than that of each of the plurality of second low carrier lifetime regions.

11. The silicon carbide semiconductor device according to claim 9, wherein
the second carrier lifetime killer is helium, protons, or vanadium.

12. The silicon carbide semiconductor device according to claim 1, wherein
the first electrode extends on the interlayer insulating film to the intermediate region, and
the first low carrier lifetime region faces the first electrode in the depth direction with the interlayer insulating film intervening therebetween.

* * * * *